United States Patent
Wegener

(10) Patent No.: US 9,158,686 B2
(45) Date of Patent: Oct. 13, 2015

(54) PROCESSING SYSTEM AND METHOD INCLUDING DATA COMPRESSION API

(75) Inventor: Albert W. Wegener, Aptos Hills, CA (US)

(73) Assignee: Altera Corporation, San Jose, CA (US)

( * ) Notice: Subject to any disclaimer, the term of this patent is extended or adjusted under 35 U.S.C. 154(b) by 511 days.

(21) Appl. No.: 13/616,898

(22) Filed: Sep. 14, 2012

(65) Prior Publication Data

US 2013/0262809 A1    Oct. 3, 2013

Related U.S. Application Data

(60) Provisional application No. 61/618,463, filed on Mar. 30, 2012, provisional application No. 61/618,534, filed on Mar. 30, 2012, provisional application No. 61/618,509, filed on Mar. 30, 2012.

(51) Int. Cl.
| | | |
|---|---|---|
| *G06F 13/00* | (2006.01) |
| *G06F 12/08* | (2006.01) |
| *H03M 7/24* | (2006.01) |
| *H03M 7/30* | (2006.01) |

(52) U.S. Cl.
CPC ............... *G06F 12/08* (2013.01); *H03M 7/24* (2013.01); *H03M 7/30* (2013.01); *H03M 7/6088* (2013.01); *G06F 2212/401* (2013.01)

(58) Field of Classification Search
CPC .............................. G06F 9/541; G06F 12/023
USPC ............................................ 711/170; 719/328
See application file for complete search history.

(56) References Cited

U.S. PATENT DOCUMENTS

| | | |
|---|---|---|
| 5,839,100 A | 11/1998 | Wegener |
| 5,974,471 A | 10/1999 | Belt |
| 6,195,024 B1 | 2/2001 | Fallon |
| 6,309,424 B1 | 10/2001 | Fallon |
| 6,597,812 B1 | 7/2003 | Fallon et al. |
| 6,862,662 B1 | 3/2005 | Cloud |
| 7,009,533 B1 | 3/2006 | Wegener |
| 7,129,860 B2 | 10/2006 | Alvarez, II et al. |
| 7,378,992 B2 | 5/2008 | Fallon |
| 7,761,488 B2 * | 7/2010 | Thaler et al. .................. 707/823 |

(Continued)

FOREIGN PATENT DOCUMENTS

WO    2007135602 A1    11/2007

OTHER PUBLICATIONS

Altior Whitepaper, "AltraFlex Compression File System Accelerator," www.altior.com, 3rd Quarter 2011, 5 pages.

(Continued)

*Primary Examiner* — Andy Ho
(74) *Attorney, Agent, or Firm* — Okamoto & Benedicto LLP

(57) ABSTRACT

Memory system operations are extended for a data processor by an application programming interface API, including a set of operations and parameters for the operations, which provides for data compression and decompression during or in conjunction with processes for moving data between memory elements of the memory system. The set of operations can be configured to use the parameters and perform the operations of the API. The API can support moves between memory having a first access latency, such as memory integrated on the same chip as a processor core, and memory having a second access latency that is longer than the first access latency, such as memory on a different integrated circuit than the processor core.

43 Claims, 12 Drawing Sheets

(56) References Cited

U.S. PATENT DOCUMENTS

| | | | |
|---|---|---|---|
| 8,204,106 | B2 | 6/2012 | Sadowski et al. |
| 2005/0204081 | A1 | 9/2005 | Wang |
| 2005/0257019 | A1* | 11/2005 | He .............................. 711/170 |
| 2007/0067483 | A1 | 3/2007 | Fallon |
| 2009/0089454 | A1 | 4/2009 | Huggahalli et al. |
| 2009/0172245 | A1* | 7/2009 | Dunstan ....................... 711/101 |
| 2009/0178061 | A1 | 7/2009 | Sandoval et al. |
| 2011/0004737 | A1* | 1/2011 | Greenebaum ................ 711/163 |
| 2011/0078222 | A1 | 3/2011 | Wegener |
| 2011/0099295 | A1 | 4/2011 | Wegener |
| 2011/0218974 | A1* | 9/2011 | Amit et al. .................... 707/693 |
| 2011/0288785 | A1* | 11/2011 | Tembe ............................ 702/20 |
| 2013/0007076 | A1 | 1/2013 | Wegener |

OTHER PUBLICATIONS

Bauer, Michael, Henry Cook, and Brucek Khailany. Slide presentation "CudaDMA: Optimizing GPU Memory Bandwidth via Warp Specialization," presented at High Performance Computing, Networking, Storage and Analysis (SC), Nov. 12-18, 2011 International Conference for, 31 pages.

Benini, L. et al. "Memory Energy Minimization by Data Compression: Algorithms, Architectures and Implementation." IEEE Transactions on Very Large Scale Integration (VLSI) Systems, vol. 12, No. 3, Mar. 2004, pp. 255-268.

Filgueira et al., Adaptive-Compi: Enhancing Mpi-Based Applications' Performance and Scalability by using Adaptive Compression, International Journal of High Performance Computing Applications, Jul. 26, 2010 at http://hpc.sagepub.com/content/25/1/93, 23 pages.

Filgueira, R., et al., "Exploiting data compression in collective I/O techniques," Cluster Computing, 2008 IEEE International Conference on, Sep. 29, 2008-Oct. 1, 2008, pp. 479-485.

Glaskowsky, Peter, white paper, "NVIDIA's Fermi: The First Complete GPU Computer Architecture," Sep. 2009, 26 pages.

Hammel, Michael J., "Embedded Linux: Using Compressed File Systems," downloaded from http://lwn.net/Articles/219827, Jan. 30, 2007, 7 pages.

Jian Ke, et al., "Runtime Compression of MPI Messages to Improve the Performance and Scalability of Parallel Applications," Supercomputing, 2004. Proceedings of the ACM/IEEE SC2004 Conference, Nov. 6-12, 2004, 7 pages.

Lekatsas/Yang et al., "CRAMES: compressed RAM for embedded systems," Hardware/Software Codesign and System Synthesis, 2005. CODES+ISSS '05. Third IEEE/ACM/IFIP International Conference on, Sep. 2005, pp. 93-98.

Mahapatra, N. et al. "The Performance Advantage of Applying Compression to the Memory System." ACM Workshop on Memory System Performance (MSP 2002), Jun. 2002, pp. 86-96.

Nitta, C. et al. "Techniques for Increasing Effective Data Bandwidth." IEEE International conference on Computer Design, Oct. 2008, pp. 514-519.

NVIDIA White Paper "NVIDIA's Next Generation CUDA Compute Architecture: Fermi," available at http://www.nvidia.com/content/PDF/fermi_white_papers/NVIDIA_Fermi_Compute_Architecture_Whitepaper.pdf</url>, 2009, 22 pages.

O'Reilly, "Reading and Writing Compressed Filed PHP Cookbook," downloaded from http://docstore.mik.ua/orelly/webprog/pcook/ch18_26.htm on Jan. 20, 2012, 2 pages.

Wegener, U.S. Appl. No. 13/358,511, filed Jan. 25, 2012, 49 pages.
Wegener, U.S. Appl. No. 13/617,061, filed Sep. 14, 2012, 78 pages.
Wegener, U.S. Appl. No. 13/617,205, filed Sep. 14, 2012, 70 pages.
Wolfe, M., and C. Toepfer. "The PGI accelerator programming model on NVIDIA GPUs." The Portland Group Insider (Jun. 2009), 27 pages.

PCT Search Report and Written Opinion from PCT/US2013/034426 mailed May 30, 2013, 9 pages.

* cited by examiner

PROCESSING SYSTEM AND METHOD INCLUDING DATA COMPRESSION API

RELATED APPLICATIONS

This application claims benefit of U.S. Provisional Patent Application No. 61/618,463 filed on 30 Mar. 2012, entitled PROCESSING SYSTEM AND METHOD INCLUDING DATA COMPRESSION API.

This application is related to U.S. Patent Application No. 61/618,534, filed on 30 Mar. 2012, entitled DATA COMPRESSION FOR DIRECT MEMORY ACCESS TRANSFERS, and is also related to U.S. Patent Application No. 61/618,509, filed on 30 Mar. 2012, entitled CONVERSION AND COMPRESSION OF FLOATING POINT AND INTEGER DATA, all of which are incorporated by reference.

BACKGROUND

1. Field of the Invention

The present invention relates to computer system operation, including data transfer operations among the elements of a memory system that include data compression and decompression.

2. Description of Related Art

In some computer systems, including multicore processors systems and graphical processor systems, memory is organized hierarchically. The memory hierarchy can include a relatively small first level (L1) cache memory and a larger second level (L2) cache memory on the same integrated circuit as the processor core circuitry, along with off-chip, large scale memory implemented often using dynamic random access memory. In some configurations, a third level (L3) cache can be included on-chip. Other memory can be used for sharing data among processor cores, such as shared cache memory and message-passing memory. Additional memory in the hierarchy can include persistent stores, such as flash memory, magnetic disk drive memory, network-attached storage and so on. Given the variety of memory technologies, the organization of memory systems is very diverse.

Also, there are many varieties of computer system architectures, each of which can include different memory system configurations. My co-pending U.S. patent application Ser. No. 12/891,312, entitled ENHANCED MULTI-PROCESSOR WAVEFORM DATA EXCHANGE USING COMPRESSION AND DECOMPRESSION, filed 27 Sep. 2010 (US 2011/0078222), which is incorporated by reference as if fully set forth herein, describes several computer system architectures, and demonstrates the variety architectures and memory configurations being commonly deployed.

As processor performance has improved, processors are executing programs over larger and larger data sets. Also, one processor or group of processors may concurrently execute many programs, each of which requires access to different sizes and types of data sets. For example, broad varieties of application programs acquire, collect, process, and display numerical data. Numerical data includes a variety of data types, such as integers, floating-point numbers, image data, video data, and graphics objects. Numerical data can be accumulated in large files, or acquired at high speeds, and movement of such data among elements of processor system memory hierarchies can cause bottlenecks in system performance.

Thus, the amount of memory available, in terms of the number of bytes, at each element of a memory system for a given computer system, and the bandwidth of the data channels among the elements of the memory system, can limit the efficiency and speed with which a given program can be executed. Given the variant computer systems architectures and variant memory system configurations, the control of data flow among the memory elements is often implemented in a platform-specific manner. This platform-specific memory management interferes with users' ability to individually manage data flow to improve the efficiency of the utilization of memory resources in a given computer system.

It is desirable to provide technologies that can be employed to improve efficiency of memory system operations in computer systems.

SUMMARY

Memory system operations are extended for a data processor by an application programming interface (API), including a set of operations and parameters for the operations, which provides for data compression and decompression during or in conjunction with processes for moving data between memory elements of the memory system. The set of operations can be implemented in the data processor using software-implemented functions, which can be hardware-assisted, configured to use the parameters and perform the operations of the API. The API can support moves between memory having a first access latency, such as memory integrated on the same chip as a processor core, and memory having a second access latency that is longer than the first access latency, such as memory on a different integrated circuit than the one including a processor core or cores. In such data move operations, any added latency associated with the compression or decompression can be absorbed with less impact on access by the processor core to mission critical data.

Parameters of the API can include indicators of data type, size of a sample set, and compressed data location (destination for a compression operation, source for a decompression operation), uncompressed location (destination for a decompression operation, source for a compression operation), and a selected compression mode, such as lossless, fixed rate, or fixed quality modes. Operations of the API include engines that move data between the compressed data location and the uncompressed location, in conjunction with which one of compression and decompression is performed, as specified by parameters of the API. Data in an uncompressed location as the term "uncompressed" is used herein can refer to data which can be provided as input to a compression engine, or as data output from a decompression engine, including never-compressed data or previously compressed and then decompressed data. A set of different algorithms can be included in the operations of the API, and parameters of the API can identify a selected one of the different algorithms to be applied for compression and decompression operations in a particular data move operation. The set of different algorithms can include algorithms specialized for data types identified in the parameters of the API, including for example algorithms for compression of floating-point numbers, algorithms for compression of integers, algorithms for compression of image data, and so on. Also, the set of different algorithms can include algorithms specialized for compression qualities as identified in the parameters of the API, such as lossless compression, lossy compression of different types, compression to achieve specified compression ratios, algorithms that maintain specified limits on compression quality in terms of loss of data, and so on.

A data processor is described that includes an API which provides for compression and decompression in conjunction with processes that move data between memory elements of a memory system deployed in, or otherwise accessible by, the data processor. The data processor can execute user application programs that utilize the API. Users can develop user application programs that rely on the API, without being burdened by the specific configuration of a hardware platform on which the user application is to be executed.

Other aspects and advantages of the present invention can be seen on review of the drawings, the detailed description and the claims, which follow.

DETAILED DESCRIPTION

A detailed description of embodiments of the present invention is provided with reference to the FIGS. 1-16.

Figure 1:
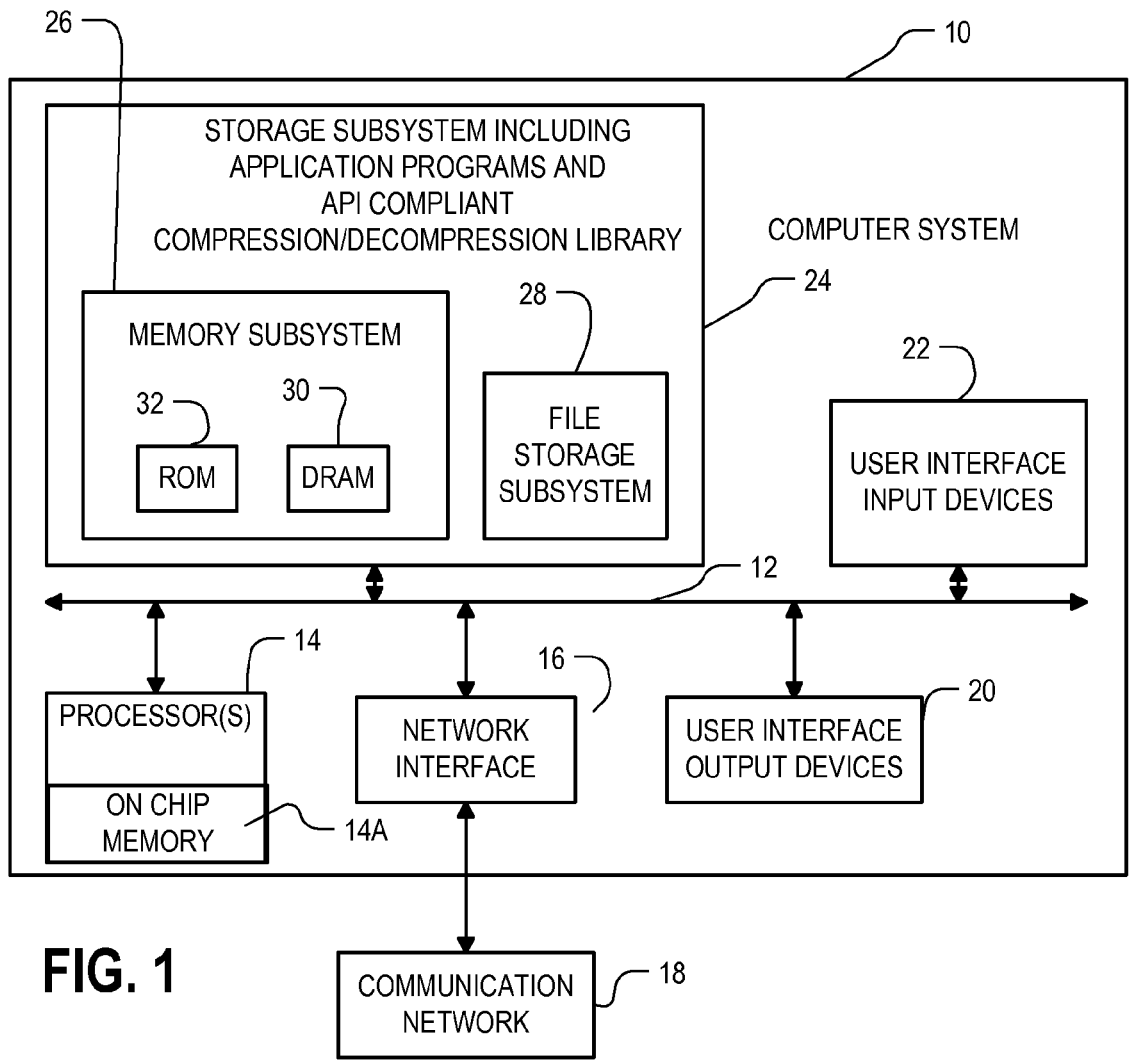
FIG. 1 is a simplified block diagram of a computer system including an API compliant compression/decompression library.

FIG. 1 is a simplified block diagram of a data processor 10 embodying a compression/decompression API. Data processor 10 typically includes at least one processor or processors 14 used to execute application programs which communicate(s) with a number of peripheral devices via bus subsystem 12. The processor(s) 14 can include internal or on-chip memory 14A, including one or more levels of cache memory, for example. The processor(s) can comprise a variety of underlying hardware platforms which can be configured to operated on numerical data at a variety of speeds. Example hardware platforms include but are not limited to the following:

Intel or AMD x86 CPU @ 3+GHz (1 core),
Nvidia Fermi-class GPU (1 streaming multi-processor (SMP)),
Altera/Xilinx field-programmable gate array (FPGA), including Zynq,
ASIC system-on-chip (SoC), such as an ARM-enabled application processor from Qualcomm (Snapdragon), Apple (A4, A5), Texas Instruments OMAP, etc.

The peripheral devices may include a storage subsystem 24, comprising a memory subsystem 26 and a file storage subsystem 28, user interface input devices 22, user interface output devices 20, and a network interface subsystem 16. The input and output devices allow user interaction with data processor 10. Network interface subsystem 16 provides an interface to outside networks, including an interface to communication network 18, and is coupled via communication network 18 to corresponding interface devices in other computer systems. Communication network 18 may comprise many interconnected computer systems and communication links, for example Ethernet or Infiniband wired links. These communication links may be wireline links, optical links, wireless links, or any other mechanisms for communication of information. While in one embodiment, communication network 18 is the Internet, communication network 18 may be any suitable computer network.

User interface input devices 22 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into data processor 10 or onto communication network 18.

User interface output devices 20 may include a display subsystem, a printer, a fax machine, or non-visual displays such as audio output devices. The display subsystem may include a cathode ray tube (CRT), a flat-panel device such as a liquid crystal display (LCD), a projection device, a retinal display, or some other mechanism for creating a visible image. The display subsystem may also provide non-visual display such as via audio output devices. In general, use of the term "output device" is intended to include all possible types of devices and ways to output information from data processor 10 to the user or to another machine or computer system.

Storage subsystem 24 stores the basic programming and data constructs that provide the functionality described herein, including application programs and an API compliant compression/decompression library. A compression/decompression library is considered API compliant if it uses some or all of the parameters of the API and implements some or all of the operations of the API.

Embodiments of the technology may include an entire library enabling programs for full compliance with a specified API for the underlying hardware configuration, or only those components of the library linked to, or that can be called by, the programs to be executed using the system. These software modules are generally executable and executed by processor(s) 14 that may optionally include some form of hardware acceleration.

Memory subsystem 26 typically includes a number of memories including a main random access memory (DRAM)

30 for storage of instructions and data during program execution and a read only memory (ROM) 32 in which fixed instructions are stored. In some systems, flash memory can be used in addition to, or in the alternative to, the ROM 32. File storage subsystem 28 provides persistent storage for program and data files, and may include a hard disk drive, a floppy disk drive along with associated removable media, a CD-ROM drive, an optical drive, or removable media cartridges such as flash drives having a USB interface. The databases and modules implementing the functionality of certain embodiments may be stored by file storage subsystem 28. As mentioned above, the processor(s) 14 may also include one or more levels of cache memory and other memory on the same integrated circuit as the processor core or cores of the processor(s) 14.

Bus subsystem 12 provides a mechanism for allowing the various components and subsystems of data processor 10 to communicate with each other as intended. Although bus subsystem 12 is shown schematically as a single bus, typical embodiments of the bus subsystem use multiple busses.

Data processor 10 itself can be of varying types including a personal computer, a portable computer, a workstation, a computer terminal, a network computer, a television, a mainframe, a supercomputer, a graphics card or accelerator, or any other data processing system or user device. Due to the ever-changing nature of computers and networks, the description of data processor 10 depicted in FIG. 1 is intended only as a specific example for purposes of illustrating the preferred embodiments. Many other configurations of data processor 10 are possible having more or less components than those depicted in FIG. 1.

The data processor 10 is capable of using the processor(s) 14 for executing a plurality of application programs, and of allocating a plurality of threads of each application program concurrently to one or more processor cores of the processor(s) 14. The multiprocessing environment creates varying needs for compression and decompression resources that can be satisfied utilizing an API, as described herein, that includes parameters and operations that can fit the varying needs. Thus, the parameters and operations of the API support a plurality of data types, a plurality of compression modes and a plurality of types of source and destination memory elements.

Figure 2:
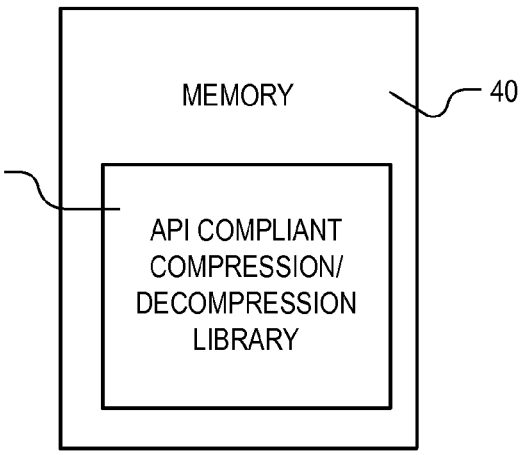
FIG. 2 illustrates an article of manufacture storing an API compliant compression/decompression library.

FIG. 2 shows a memory 40 which can comprise a non-transitory, computer readable data storage medium associated with file storage subsystem 28, and/or with network interface subsystem 16, and can include a data structure that implements an API compliant compression/decompression library 80 as described in detail below. In some embodiments, the API compliant compression/decompression library 80 is configured for a specific hardware configuration, class of hardware configurations, or for one or more hardware accelerators. In other embodiments, API compliant compression/decompression library 80 includes components that support a plurality of variant hardware configurations classes of hardware configurations. The memory 40 can be a hard disk, a floppy disk, a CD-ROM, an optical medium, removable media cartridge, or other medium that stores computer readable data in a volatile or non-volatile form.

In one embodiment, the API compliant compression/decompression library 80 is used by providing library access to a compiler, which links the application programs to the components of the library selected by the programmer. Access to the library by a compiler can be accomplished using a header file (for example, a file having a ".h" file name extension) that specifies the parameters and operations of the API and corresponding library file (for example, a file having a ".lib" file name extension, a ".obj" file name extension for a Windows operating system, or a file having a ".so" file name extension for a Linux operating system) that use the parameters and implement the operations. The components linked by the compiler to applications to be run by the computer are stored as all or part of the API in the computer system memory, possibly as compiled object code, for execution as called by the application. In other embodiments, the library can include components that can be dynamically linked to applications, and such dynamically linkable components are stored in the computer system memory as all or part of the API, possibly as compiled object code, for execution as called by the application.

Figure 3:
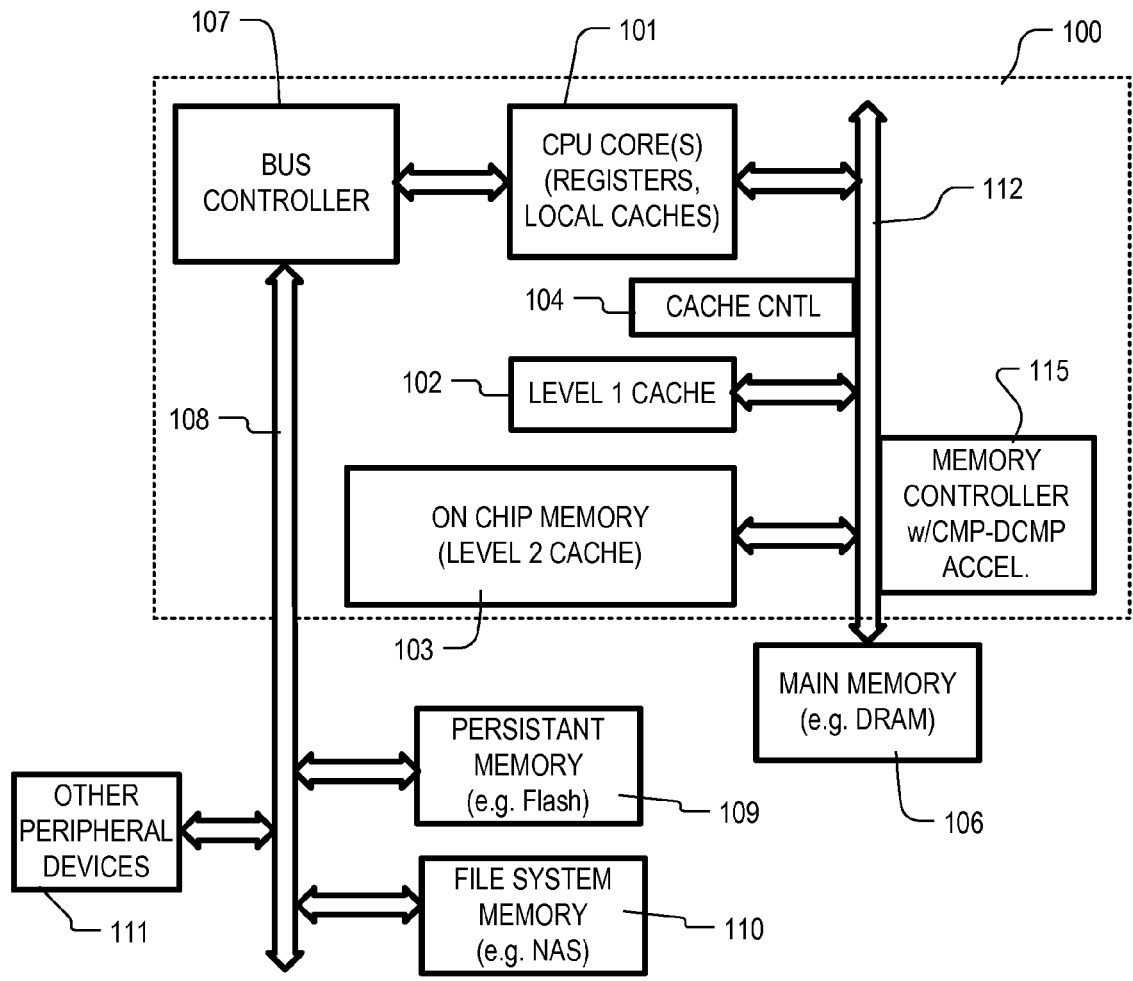
FIG. 3 is a diagram of a processor including an integrated circuit having a processor core used to execute application programs with compression and decompression accelerator logic, on-chip memory and other memory elements off-chip.

In my co-pending U.S. patent application Ser. No. 12/891,312, entitled ENHANCED MULTI-PROCESSOR WAVEFORM DATA EXCHANGE USING COMPRESSION AND DECOMPRESSION, filed 27 Sep. 2010 (US 2011/0078222), incorporation of compression and decompression resources in a variety of computer system architectures is described. For the purposes of the present description, FIG. 3 illustrates a representative configuration of such systems and of other systems.

The compression/decompression technology including a compression/decompression API can accelerate compression and decompression in a broad variety of software and hardware applications that acquire, collect, process, store and display numerical data. Numerical data consists of integers, floating-point numbers, imaging, video, and graphics objects.

Operations of the API can include:
1) Memory-to-memory acceleration between L2/L3 cache (uncompressed) on the same chip as a processor core, and off-chip DRAM (compressed) such as main memory extended by compression/decompression operations.
2) Core-to-core data transfer extended by compression/decompression operations, using:
   a) Message-passing interface (MPI) for supercomputing (where the physical layer may be compliant with a standard such as Ethernet or Infiniband, or be other types of communication media).
   b) TCP/IP streams, for general-purpose packet exchange (where the physical layer may be compliant with a standard such as Ethernet or Infiniband, or be other types of communication media.)
   c) On-chip messaging, where the physical layer may be implemented in the manner of Intel QuickPath Interconnect (QPI) technology or AMD HyperTransport (HT) technology.
3) File I/O (fopen, fread, fwrite, fclose) or other types of operating system level data moving operations extended by compression/decompression operations, supported by library files in operating systems like UNIX, LINUX, Microsoft WINDOWS, Apple OSX, and so on.

Also, the API can implement a data type or file format for use in support of the compression/decompression functions, such as described below.

One example set of operations of an API for compression and decompression includes functions that support DMA operations, such as used for moving data from a fast memory, like on-chip L2 cache memory and registers, on the same integrated circuit as a processor core, to a relatively slower but larger scale memory, like off-chip SDRAM or DDR DRAM main memory, using an on-chip memory controller. This example can be understood with reference to the following description, beginning with FIG. 3.

FIG. 3 is a simplified block diagram of a data processor that includes an integrated circuit 100 having a central processing unit CPU core(s) 101 (i.e. one or more cores) on-chip. The CPU core 101 is coupled to a memory hierarchy including a level 1 cache 102 and other on-chip memory 103, which can comprise a level 2 cache, multiple cache levels, and/or directly addressable memory space. In other implementations, different cache hierarchies can be implemented, including hierarchies that include a level 3 cache. The level 1 cache 102 and on-chip memory 103 are coupled via a communication fabric represented for simplicity by single bus 112 to an off-chip main memory 106 which can comprise high-speed dynamic random access memory or the like. Access data in the level 1 cache or other on-chip memory typically has a low access latency. Access to data in the high speed main memory 106, typically has a longer latency than access to the level 1 cache or other on-chip memory 103. A cache control block 104 is shown coupled to the bus 112, and performs cache management, including cache hit and miss operations, cache line replacement operations, predictive cache fill operations, and the like. Also, a memory controller block 115 is shown coupled to the bus 112, and manages communication of data among the CPU cores 101, the level 1 cache 102, other on-chip memory 103 and the off-chip main memory 106. The memory controller block 115 may include direct memory access (DMA) logic to support data communications on the bus 112. In this embodiment, the memory controller block 115 also includes compression and decompression acceleration logic which is utilized according to the API. The chip 100 also includes a bus controller 107 which is connected to a bus 108 that is arranged for communication with off-chip memory, such as persistent memory 109 which may be implemented using flash memory or the like, and file system memory 110 which may be implemented using disk drives or network attached storage. The bus 108 can also be configured to communicate data between the integrated circuit 100 and other peripheral devices 111. The bus 108 can configured according to a wide variety of bus architectures. In some examples, the bus 108 can be configured as a bus compliant with an industry-standard, like PCI Express. In some implementations, the other peripheral devices 111 can include additional instances of integrated circuit 100.

The compression and decompression acceleration logic in the memory controller block 115 can comprise supporting circuitry for one or more DMA channels, the number of which is selected during design of the integrated circuit 100. The compression/decompression library of the API can include a component linked to an application program for the purposes of initializing and controlling compression and decompression channels through the acceleration logic.

Figure 4:
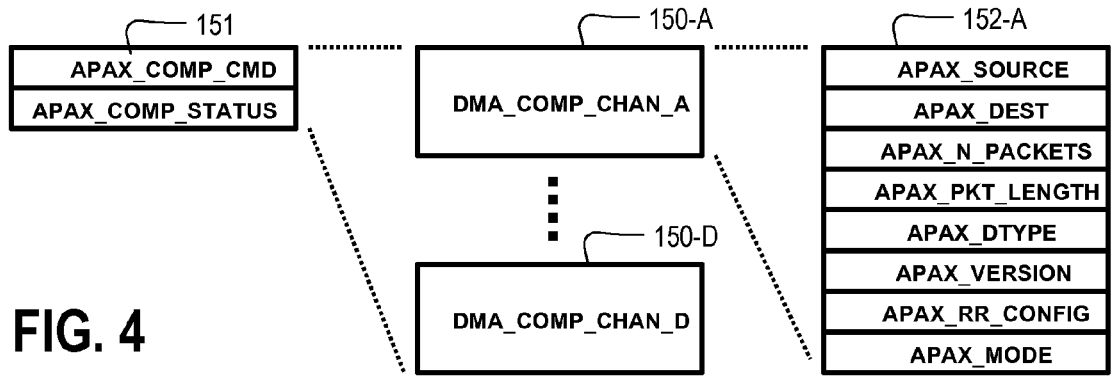
FIG. 4 is a diagram of compression channels and API parameters for a system like that of FIG. 3.
Figure 5:
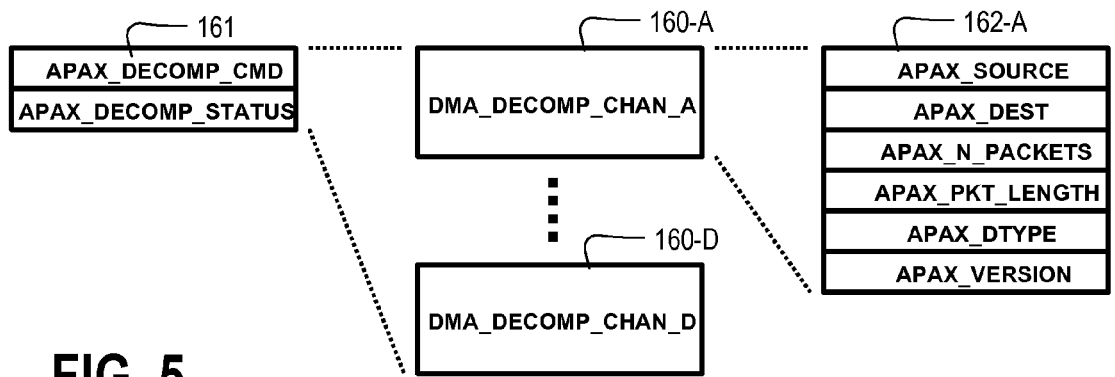
FIG. 5 is a diagram of decompression channels and API parameters for a system like that of FIG. 3.

In one example, a library component can control writing the contents of registers that hold parameters associated with the acceleration logic, including command registers, status registers and transaction descriptor registers. For example, FIG. 4 illustrates an embodiment including four DMA compression channels 150-A through 150-D. A library function or functions can set and control a command and status register 151 for the four channels. Each channel includes a set of descriptor registers, e.g. descriptor register set 152-A for compression channel 150-A. FIG. 5 illustrates an embodiment including four DMA decompression channels 160-A through 160-D, complementary to the compression channels of FIG. 4. A library function or functions can set and control a command and status register set 161 for the four channels. Each channel includes a set of descriptor registers, e.g. descriptor register set 162-A for decompression channel 160-A.

Details of a compression and decompression status and descriptor register sets for a compression and decompression DMA channel are provided for a specific implementation, referred to herein as "APAX" (for Application Acceleration) as an aid in understanding the types of parameters and operations that can be included in a compression/decompression API. Persons of skill in the art will understand that details of the parameters will be adjusted as suits a particular implementation, the types of data being compressed and decompressed, the specifications of the compression/decompression algorithms implemented by the compression/decompression library, the architecture of the hardware host supported by the compression/decompression library, and other considerations.

Thus, representative compression channel control and status registers for an APAX API using the hardware accelerator of FIGS. 4 and 5 are illustrated in Table 1 set forth below.

TABLE 1

Compression Control and Status Registers

| Field Name | Bits | Notes |
| --- | --- | --- |
| APAX_COMP_CMD | [15 ... 8] | Can be reserved |
| | [7 ... 4] | COMP_INT_ENA[4] - Enable interrupt upon completion of Descriptor D/C/B/A transaction. |
| | [3 ... 0] | DMA Channel D/C/B/A (bits [3 ... 0]) using DMA Descriptor D/C/B/A. per channel: 0 = no cmd, 1 = compress |
| APAX_COMP_STATUS | [15 ... 12] | DMA comp chan D: 0 = idle, 1 = busy |
| | [11 ... 8] | DMA comp chan C: 0 = idle, 1 = busy |
| | [7 ... 4] | DMA comp chan B: 0 = idle, 1 = busy |
| | [3 ... 0] | DMA comp chan A: 0 = idle, 1 = busy Values 2 ... 15 for each DMA comp channel can be reserved. |

Compression channel descriptors for an APAX API corresponding with those shown in FIG. 4 that can be associated with a DMA operation using the compression functions are set out in Table 2 below. The register set (e.g. 152-A) holding the compression function descriptors can be written and controlled by a component or components of a compression/decompression library implementing the API.

N_PKTS. For imaging triplets, the packet length is in units of pixels*color planes, i.e. APAX_PKT_LENGTH=768 for RGB implies that 256*3=768 samples per compressed packet. Similarly, APAX_PKT_LENGTH=4320 for Bayer matrix pairs (RGBG) that carry 1080*4=4320 samples per compressed packet. APAX_DTYPE specifies the uncompressed datatype (input of an APAX_COMP transaction, or

TABLE 2

Compression DMA Descriptor Register Set

| Field Name | Bits | RD/WR | Notes |
| --- | --- | --- | --- |
| APAX_SOURCE | [63 or 31:0] | RD/WR | Start address of the source (uncompressed) buffer. APAX transactions advance the initial APAX_SOURCE address by N_PKTS * PKT_LENGTH. |
| APAX_DEST | [63 or 31:0] | RD/WR | Start address of the destination (compressed) buffer. APAX transactions advance the initial APAX_DEST pointer by the number of 32-bit words written to the compressed array: APAX_C_LENGTH = 1 + APAX_DEST (end) − APAX_DEST (start) |
| APAX_N_PKTS | [15:0] | RD/WR | Number of packets to compress or to copy, 1 to 65535 (unsigned 16-bit int). |
| APAX_PKT_LENGTH | [15:0] | RD/WR | Number of samples per packet: any multiple of 4, from 64 to 16384 |
| APAX_DTYPE | [15:13] | RD/WR | DATATYPE:<br>0: uint   1: int   2: float   3: RGB<br>4: YUV   5: Bayer   6-8: reserved |
| | [12:10] | | BITS PER SAMPLE:<br>0: 8   1: 10   2: 12   3: 14<br>4: 16   5: 32   6: 64   7: resrvd |
| | [9:6] | | Color Image Format:<br>Formats 0-8: see below; Formats 9-15: reserved |
| | [5:4] | | YUV Color Space Decimation<br>0: none   1: 4:4:4 → 4:2:2   2: 4:4:4 → 4:2:0 |
| | [3:2] | | Color Space Conversion: 0 = OFF, 1 = RGB → YUV, 2 = RGB → YCrCb (studio), 3 = RGB → YCrCb (computer) |
| | [1:0] | | Bits [1:0] are reserved |
| APAX_VERSION | [15:0] | RD/WR | APAX version number (error conditions when APAX HW doesn't support the user-requested version) |
| APAX_RR_CONFIG | [15:13] | RD/WR | RR_STRIDE2: 1, 2, 3, 4, 6 |
| | [12:10] | | RR_MANUAL_STRIDE1: 1, 2, 3, 4, 6, N_FIFO |
| | [9] | | RR_MANUAL_ADD_SUB: 0: subtract 1: add |
| | [8:7] | | RR_MANUAL_DERIV: 0, 1, 2 (samps, diff1, diff2) |
| | [6:3] | | Bits [6:3] are reserved |
| | [2:0] | | RR_AUTO_MANUAL (0 = AUTO, 1 = MANUAL)<br>Bit 2: STRIDE1<br>Bit 1: ADD_SUB<br>Bit 0: DERIV |
| APAX_MODE | [15:12] | RD/WR | C_MODE:<br>0: copy only   1: Lossless   2: Average Rate<br>3: Constant Rate   4: Fixed Quality (increments of 0.5 dB)<br>For floating-point input ONLY:<br>5: FP2 fixed rate   6: FP2 ABS error   7: FP2 REL error<br>8: FP4 fixed rate   9: FP4 ABS error   10: FP4 REL error<br>11-14: reserved |
| | [11:0] | | C_PARAM (10, 11, or 12 bits):<br>Avg & Const Rate:   # dwords per packet in [11:0]<br>Fixed quality (dB):   ATTEN (6.4 format, [9:0])<br>FP2, FP4 ABS error:   EXP_THRESH (floats; [10:0])<br>FP2, FP4 REL error:   % error (0.1% to 99.9%, [9:0]) |
| APAX_H_DIM | [15:0] | RD/WR | Number of samples or color components per 2D row. |
| APAX_V_DIM | [15:0] | RD/WR | Number of rasters per 2D frame, or rows per 2D matrix. |

The APAX_SOURCE register contains the 32-bit or 64-bit start address of the array to be compressed. The APAX_DEST register contains the 32-bit or 64-bit start address where compressed packets will be written. The APAX_N_PKTS register specifies how many packets will be compressed during the transaction, from 1 to 65535 (0 is invalid). APAX_PKT_LENGTH specifies the number of samples per packet, a multiple of 4 samples from 64 to 16384 (values below 64 are invalid). Note that APAX_PKT_LENGTH specifies a sample count; the number of bytes to be compressed during the DMA transaction is a function of D_TYPE, PKT_LENGTH, and the output of an APAX_DECOMP transaction). APAX_DTYPE[15:13] specify six uncompressed datatypes ((unsigned integer uint, signed integer int, floating-point number (exponent, mantissa) float, RGB pixel set, YUV pixel set, or Bayer matrix pixel set).

APAX_DTYPE[12:10] specify the bit widths (8, 10, 12, 14, 16, 32, or 64 bits) of each uncompressed datum. Certain combinations of datatype and bit width can be prohibited, including 8-bit or 16-bit floats, or 64-bit ints or uints.

APAX_DTYPE[9:6] specify color image formats, such as the following formats 0-8:

| Format 0 4:4:4 (8 bits) | |
|---|---|
| 8 bit 8 bit 8 bit 8 bit | |
| Y0_U0_V0_8'h00 | $Y_{0,0}$—$U_{0,0}$—$V_{0,0}$—8'h00 |
| Y1_U1_V1_8'h00 | $Y_{0,1}$—$U_{0,1}$—$V_{0,1}$—8'h00 |
| ... or | |
| R0_G0_B0_8'h00 | $R_{0,0}$—$G_{0,0}$—$B_{0,0}$—8'h00 |
| R1_G1_B1_8'h00 | $R_{0,1}$—$B_{0,1}$—$B_{0,1}$—8'h00 |
| ... | |

| Format 1 4:4:4 (10 bits) | |
|---|---|
| 10 bit 10 bit 10 bit 2 bit | |
| Y0_U0_V0_2'b00 | $Y_{0,0}$—$U_{0,0}$—$V_{0,0}$—2'b00 |
| Y1_U1_V1_2'b00 | $Y_{0,1}$—$U_{0,1}$—$V_{0,1}$—2'b00 |
| ... | |

| Format 2 4:4:4 (16 bits) | |
|---|---|
| 16 bit 16 bit | |
| Y0_U0 | $Y_{0,0}$—$U_{0,0}$ |
| V0_16'h0000 | $V_{0,0}$—16'h0000 |
| Y1_U1 | $Y_{0,1}$—$U_{0,1}$ |
| V1_16'h0000 | $V_{0,1}$—16'h0000 |
| ... | |
| R0_G0 | $R_{0,0}$—$G_{0,0}$ |
| B0_16'h0000 | $B_{0,0}$—16'h0000 |
| R1_G1 | $R_{0,1}$—$G_{0,1}$ |
| B1_16'h0000 | $B_{0,1}$—16'h0000 |
| ... | |

| Format 3 4:2:2 (8 bits) | |
|---|---|
| Y0_U0_Y0_V0 | $Y_{0,0}$_$U_{0,0}$_$Y_{0,1}$_$V_{0,0}$ |
| Y1_U1_Y1_V1 | $Y_{0,2}$_$U_{0,2}$_$Y_{0,3}$_$V_{0,2}$ |
| Y2_U2_Y2_V2 | $Y_{0,4}$_$U_{0,4}$_$Y_{0,5}$_$V_{0,4}$ |
| Y3_U3_Y3_V3 | $Y_{0,6}$_$U_{0,6}$_$Y_{0,7}$_$V_{0,6}$ |
| ... | |

| Format 4 4:2:2 (10/12/14/16 bits) | |
|---|---|
| Y0_U0 | $Y_{0,0}$_$U_{0,0}$ |
| Y0_V0 | $Y_{0,1}$_$V_{0,0}$ |
| Y1_U1 | $Y_{0,2}$_$U_{0,2}$ |
| Y1_V1 | $Y_{0,3}$_$V_{0,2}$ |
| Y2_U2 | $Y_{0,4}$_$U_{0,4}$ |
| Y2_V2 | $Y_{0,5}$_$V_{0,4}$ |
| Y3_U3 | $Y_{0,6}$_$U_{0,6}$ |
| Y3_V3 | $Y_{0,7}$_$V_{0,6}$ |
| ... | |

| Format 5 4:2:0 (8 bits) | |
|---|---|
| 8 bit 8 bit 8 bit 8 bit | |
| Y0_Y0_Y0_Y0 | $Y_{0,0}$—$Y_{0,1}$—$Y_{1,0}$—$Y_{1,1}$ |
| U0_V0_16'h0000 | $U_{0,0}$—$V_{0,0}$—16'h0000 |
| Y1_Y1_Y1_Y1 | $Y_{0,2}$—$Y_{0,3}$—$Y_{1,2}$—$Y_{1,3}$ |
| U1_V1_16'h0000 | $U_{0,2}$—$V_{0,2}$—16'h0000 |
| ... | |

| Format 6 4:2:0 (10 bits) | |
|---|---|
| 10 bit 10 bit 10 bit 2 bit | |
| Y0_Y0_U0_2'b00 | $Y_{0,0}$—$Y_{0,1}$—$U_{0,0}$—2'b00 |
| Y0_U0_V0_2'b00 | $Y_{1,0}$—$Y_{1,1}$—$V_{0,0}$—2'b00 |
| Y1_Y1_U1_2'b00 | $Y_{0,2}$—$Y_{0,3}$—$U_{0,2}$—2'b00 |
| Y1_Y1_V1_2'b00 | $Y_{1,2}$—$Y_{1,3}$—$V_{0,2}$—2'b00 |
| ... | |

| Format 7 4:2:0 (12/14/16 bits) | |
|---|---|
| 16 bit 16 bit | |
| Y0_Y0 | $Y_{0,0}$—$Y_{0,1}$ |
| Y0_Y0 | $Y_{1,0}$—$Y_{1,1}$ |
| U0_V0 | $U_{0,0}$—$V_{0,0}$ |
| Y1_Y1_ | $Y_{0,2}$—$Y_{0,3}$ |
| Y1_Y1 | $Y_{1,2}$—$Y_{1,3}$ |
| U1_V1 | $U_{0,2}$—$V_{0,2}$ |
| ... | |

| Format 8 RGB 5:6:5 | |
|---|---|
| 5 bit 6 bit 5 bit | |
| R0_G0_B0 | $R_{0,0}$—$G_{0,0}$—$B_{0,0}$ |
| R0_G0_B0 | $R_{0,0}$—$G_{0,0}$—$B_{0,0}$ |

APAX_DTYPE[5:4] control optional color space decimation (none, 4:4:4 →4:2:2, or 4:4:4→4:2:0). Similarly, RGB→YUV conversion prior to compression is enabled by APAX_DTYPE[3:2].

APAX_VERSION specifies the APAX algorithm version number that can be used during the APAX transaction. APAX_VERSION can be stored in the .sfy file header, as described below with respect to FIG. 7. If the APAX_COMP block does not support the algorithm version specified in APAX_VERSION, an error code can be returned in the block's associated APAX_COMP_STATUS bits.

APAX_RR_CONFIG configures the APAX redundancy remover (RR) for the compression operations described below. Three RR parameters (DERIV, ADD_SUB, and STRIDE1) can be configured for automatic or manual operation using bits APAX_RR_CONFIG[2:0]. A "0" in these bits indicates the parameter will be automatically selected by the center frequency estimator block (see Section 4.7), while a "1" indicates a manual selection by the user.

APAX_RR_CONFIG bits [15:13] select manually from among five RR_STRIDE2 values (1, 2, 3, 4, or 6). STRIDE2 is a fixed parameter for the duration of the transaction and for all packets in a .sfy file; STRIDE2 is not modified by the contents of packet headers, as STRIDE1 can be. APAX_RR_CONFIG bits [12:10] manually select from among six RR_STRIDE1 values (1, 2, 3, 4, 6, or N_FIFO). APAX_RR_CONFIG bit [9] specifies the ADD_SUB operation (0=subtract, 1=add). APAX_RR_CONFIG bits [8:7] specify the manual DERIV value (0, 1, or 2). RR_AUTO_MANUAL (APAX_RR_CONFIG[2:0]) determines whether DERIV, ADD_SUB, and STRIDE1 are automatically or manually selected. APAX_MODE[15:12] selects from among eight supported compression modes:

copy from SOURCE to DEST [no compression or decompression],
lossless mode,
average rate mode (C_PARAM=target number of 32-bit words per compressed packet),
constant rate mode (C_PARAM=target number of 32-bit words per compressed packet),
fixed quality mode (C_PARAM=dynamic range specified in 0.5 dB increments),
for floating-point datatypes only:
two or four bin, fixed rate mode (target number of 32-bit words per packet)
two or four bin, fixed quality (minimum exponent to quantize to 0.0)
two or four bin, relative fixed quality (% error, from 0.1% to 99.9%, increments of 0.1%)

APAX_MODE[11:0], also called C_PARAM (compression parameter for lossy modes) is a multi-purpose set of bits, whose meaning and bit width depends on C_MODE. For Average Rate and Constant Rate modes, C_PARAM is a 12-bit value specifying the number of 32-bit words in each compressed packet (including the packet header bits). Because APAX_PKT_LENGTH in number of samples can reach 16384 (14 bits), and for DTYPE values as wide as 64 bits per sample, the mapping from C_PARAM is non-linear.

For instance, 64-bit floats having the largest PKT_LENGTH=16384 occupy 8*16384=131,072 Bytes or 32,768×32-bit words before compression. To express 1.1:1 compression for a packet of 16384×64-bit floats, the target 32-bit compressed packet length would equal 29,789, which would require 15 bits and which would not fit directly into the 12-bit C_PARAM field. In order to express target packet sizes up to 32,768, we use the non-linear mapping] which uses four different increment values (1, 4, 8, and 16) between C_PARAM values. In addition, a packet size of 32,768×32-bit floats per compressed packet is encoded as C_PARAM=0xFFF. APAX_RR_CONFIG and APAX_MODE registers might only be referenced during APAX compress transactions. These two registers are not used for the APAX_DECOMP DMA descriptor, but APAX_RR_CONFIG and APAX_MODE are stored in each APAX compressed file header.

For 1-dimensional (1D) data that repeats every N samples, or two-dimensional (2D) data that has a fixed raster length, APAX_H_DIM contains the number of samples per row or packet. For 3 color planes (typical), number of samples is 3* number of pixels per raster. For 2D data, APAX_V_DIM contains the number of rasters (rows) per frame. The "first packet in frame" bit of the first packet in a frame will be set (=1) in the packet header, while the "first packet in frame" bit for all other packets in the frame will be clear (=0).

Representative decompression channel control and status registers for an APAX API, corresponding with the register set 161 of FIG. 5, are illustrated in Table 3 set forth below.

TABLE 3

Decompression Control and Status Registers

| Field Name | Bits | Notes |
|---|---|---|
| APAX_DECOMP_CMD | [15 . . . 8] | Reserved |
| | [7 . . . 4] | DECOMP_INT_ENA[4] - Enable interrupt upon completion of Descriptor D/C/B/A transaction. |
| | [3 . . . 0] | DMA Channel D/C/B/A (bits [3 . . . 0]) using DMA Descriptor D/C/B/A. per channel: 0 = no cmd, 1 = decompress |
| APAX_DECOMP_STATUS | [15 . . . 12] | DMA decomp chan D: 0 = idle, 1 = busy, 2 = SYNC_ERR |
| | [11 . . . 8] | DMA decomp chan C: 0 = idle, 1 = busy; 2 = SYNC_ERR |
| | [7 . . . 4] | DMA decomp chan B: 0 = idle, 1 = busy; 2 = SYNC_ERR |
| | [3 . . . 0] | DMA decomp chan A: 0 = idle, 1 = busy; 2 = SYNC_ERR Values 3 . . . 15 for each DMA decomp channel are reserved. |

Decompression channel descriptors for an APAX API corresponding with those shown in FIG. 5 that can be associated with a DMA operation using the compression functions are set out in Table 4 below. The register set (e.g. 162-A) holding the decompression function descriptors can be written and controlled by a component or in components of a compression/decompression library.

TABLE 4

Decompression DMA Descriptor

| Field Name | Bits | RD/WR | Notes |
|---|---|---|---|
| APAX_SOURCE | [63 or 31:0] | RD/WR | Start address of the source (compressed) buffer. APAX transactions advance the initial APAX_SOURCE address by N_PKTS * PKT_LENGTH. |
| APAX_DEST | [63 or 31:0] | RD/WR | Start address of the destination (decompressed) buffer. APAX transactions advance the initial APAX_DEST pointer by the number of 32-bit words read from the compressed array. |
| APAX_N_PKTS | [15:0] | RD/WR | Number of packets to decompress, 1 to 65535 (unsigned 16-bit int). |
| APAX_PKT_LENGTH | [15:0] | RD/WR | Number of samples per packet: any multiple of 4, from 64 to 16384 |
| APAX_DTYPE | [15:13] | RD/WR | DATATYPE:<br>0: uint  1: int  2: float  3: RGB<br>4: YUV  5: Bayer  6-8: reserved |
| | [12:10] | | BITS_PER_SAMPLE:<br>0: 8  1: 10  2: 12  3: 14<br>4: 16  5: 32  6: 64  7: resrvd |
| | [9:6] | | Color Image Format: (described above)<br>Format 0-8: Format 9-15: reserved |

TABLE 4-continued

Decompression DMA Descriptor

| Field Name | Bits | RD/WR | Notes |
|---|---|---|---|
| | [5:4] | | YUV Color Space Decimation<br>0: none  1: 4:4:4 → 4:2:2  2: 4:4:4 → 4:2:0 |
| | [3:2] | | Color Space Conversion: 0 = OFF, 1 = RGB → YUV, 2 = RGB → YCrCb (studio), 3 = RGB → YCrCb (computer) |
| | [1:0] | | Bits [1:0] are reserved |
| APAX_VERSION | [15:0] | RD/WR | APAX version number (error conditions when APAX HW doesn't support the user-requested version) |

The registers shown in Table 4 are like those of Table 2, with the exception of the APAX_RR_CONFIG and APAX_MODE registers. The APAX_RR_CONFIG and APAX_MODE registers are only referenced during APAX compress transactions. These two registers are not used for the APAX_DECOMP DMA descriptor, but rather the library function utilizing the channel can store the APAX_RR_CONFIG and APAX_MODE parameters in each APAX compressed file header.

Figure 6:
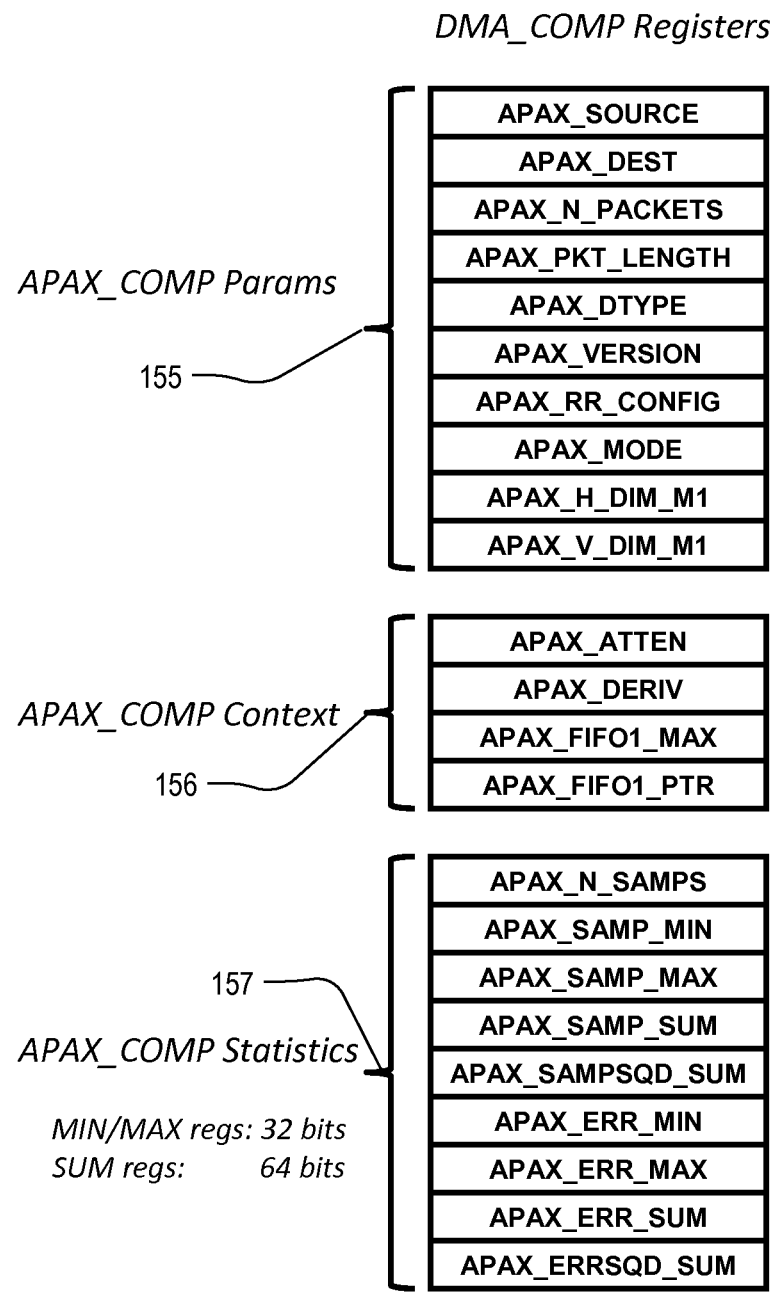
FIG. 6 illustrates parameters of an API which can be included in registers in a system like that of FIG. 3.

FIG. 6 illustrates a list of APAX_COMP (compression) registers that can be implemented in hardware on acceleration logic to hold parameters of the API and other values used in the compression function, including a group 155 of ten APAX_COMP parameter registers (corresponding to the descriptor register set discussed above), a group 156 of four APAX_COMP context registers and a group 157 of nine statistics-gathering registers. The four APAX_COMP context registers all save context from the APAX Redundancy Remover (RR). "Context" for a DMA_COMP channel means "the last time that an active software thread called this APAX_COMP channel, its Redundancy Remover settings included these four values." It will be understood that complementary list of decompression registers can also be provided.

The group 156 of context registers includes APAX_ATTEN, which is a 10-bit setting for the attenuator 332 of the redundancy remover (RR) 306. APAX_DERIV is the last chosen derivative order (0, 1, or 2). APAX_FIFO1_MAX which is the length in samples of the FIFO buffer 344 used for the application thread, which may be less than or equal to the maximum buffer length N in FIG. 11. APAX_FIFO1_PTR is the pointer into FIFO buffer 344, specifying the FIFO sample that should be correlated with the next input sample in a new DMA_COMP transaction. The group 157 of nine APAX_COMP statistics registers gathers information on both the input signal and the decompressed signal. The parameter APAX_N_SAMPS indicates the number of input samples used for calculating the statistics. Statistics on the input samples includes the minimum sample APAX_SAMP_MIN, maximum sample APAX_SAMP_MAX, the sum of samples APAX_SAMP_SUM and the sum of squared samples APAX_SAMPSQD_SUM. Since taking derivatives in the redundancy remover (RR) 306 and performing bit packing in the bit packer 308 are both lossless operations, the attenuator 332 is the only source of loss during compression (see FIG. 11). Error computations for the statistics collection block 157 may be performed after the attenuator 332. The redundancy remover 306 amplifies the attenuated signal (multiply by the inverse of the attenuation value) to produce the identical signal that the signal regenerator 404 will generate after the bit unpacking. Subtracting the amplified attenuated signal from the input signal provides an error signal used for the calculating the statistics for the compression statistics registers 157. The error statistics include minimum error APAX_ERR_MIN, maximum error APAX_ERR_MAX, sum of errors APAX_ERR_SUM and sum of squared errors APAX_ERRSQD_SUM. It is also possible to use the input and error signal statistics in an adaptive loop that adjusts various compression parameters to achieve certain signal quality levels.

An APAX_Stream_Header struct can be created and initialized to support the API compression/decompression library functions compliant with the API. A function is "compliant" with the API if it accepts parameters specified by the API, and when executed causes performance of the operations identified and/or modified by the parameters. Such a header file for a C language implementation in an example in which to index a total of 2048 packets every 64 packets can be expressed as follows:

```
1    typedef struct _APAX_Stream_Header {
2        uint16   sz;  // size (bytes) of struct
3        byte     magicno[12]; // "samplifyAPAX"
4        uint16   nPkts;
5        uint16   pktLen; // # samples per pkt
6        enum     dataType;
7        byte     majorMinorVersion[2];
8        enum     rrCfg;
9        enum     mode;
10       uint32   nIndices;
11       uint16   pktsPerIndex;
12       uint32   index[1];
13   } APAX_Stream_Header;
14
15   // example: 2048 packets total with index every 64
16   // packets nIndices = 2048 / 64;
17
18   // calc the length of the stream header
19   uint32 hdrsz = sizeof(APAX_Stream_Header) +
20       nIndices*sizeof(uint32);
21   APAX_Stream_Header *hdr = APAX_Stream_Header
22   *)malloc(hdrsz);
23
24   hdr->sz = hdrsz;
25   hdr->pktsPerIndex = 64;
26   hdr->nIndices = nIndices;
27   ...
```

Lines 1-13 set up the Stream Header of an operation of the API, including a number of indices in embodiments, or in instances of the stream header in a single embodiment, where random access to uncompressed data from a compressed file is implemented using the indexes.

Lines 19-27 determine a stream header length, which depends on the number of indices included.

For random access into a stream of compressed APAX packets, the APAX transaction size (determined by bits [15 . . . 1] of the APAX_CMD register) can correspond to the specified random access index granularity. If APAX transactions are executed one packet at a time, by setting bits [15 . . . 1] of the APAX_CMD register to 0x1, the index granularity will be 1 packet. For example, if the packet size is 256 samples and the desired index granularity is 4 packets, the APAX user will have a random access indexing granularity of 1024 samples.

In some embodiments, a header file may not be used. For example, in some systems using dynamic library functions, such as JAVA-based systems, header files may not be used.

The following typedef's can be used to define the DMA compress and decompress transaction registers described above for implementations that extend a C or C++ standard library, or other standard programming language library, that supports the typedef keyword. Note that the APAX_HW_COMP and APAX_HW_DECOMP registers share 6 of 8 registers, and that this example implementation utilizes the APAX_HW typedef for the shared registers.

```
1    typedef struct _APAX_HW {
2        APAX_SRC;
3        APAX_DST;
4        ...
5        APAX_VERSION;
6    } APAX_HW;
7
8    typedef struct _APAX_HW_COMP {
9        APAX_HW shared; // amongst compressor &
10       decompressor
11       RR_CONFIG;
12       MODE;
13   } APAX_HW_COMP;
14
15   typedef APAX_HW APAX_HW_DECOMP;
```

For the APAX example, a set of six C functions can be included in an APAX API (i.e., comprise an API compliant set of functions) for a system performing DMA operations with compression and decompression:

```
1    // APAX Header
2    // Stream header is of variable size because it might
3    // not have any indices for random access
4
5
6    typedef struct _APAX_Stream_Header {
7    } APAX_Stream_Header;
8
9    // MMR (memory mapped registers) for low-level
10   // control of the APAX HW
11   typedef _APAX_HW {
12       uint32 APAX_SOURCE;
13       uint32 APAX_DEST;
14       uint16 APAX_N_PACKETS;
15       ...
16       // see Table 2 above
17   } APAX_HW;
18
19   // initialize MMRs
20   APAX_HW APAX_init(APAX_Stream_Header *hdr, additional
21   parameters);
22   // initialize a specific DMA channel
23   Status APAX_initDMACHan(enum chan, APAX_HW *hw);
24   // prepare for compression (samplify)
25   Status APAX_prep4sfy(int indx, APAX_Stream_Header
26   *hdr, APAX_HW *hw, void *ptr_uncomp, int32
27   *ptr_comp);
28   // compress call will increment pointers
29   Status APAX_compress(int npkts, APAX_HW *hw, void
30   **ptr_uncomp, int32 **ptr_comp);
31   // prepare for decompression (desamplify)
32   Status APAX_prep4dsy(int pkt, APAX_Stream_Header
33   *hdr, APAX_HW *hw, int32 *ptr_comp, void
34   *ptr_uncomp);
35   // decompress call will increment pointers
36   Status APAX_decompress(int npkts, APAX_HW *hw, int32
37   **ptr_comp, void **ptr_uncomp);
```

The operations of the API just listed use the parameters of the API, and can be explained with reference to the line numbers as follows:

Lines 6 and 7 call an operation to create the APAX_Stream_Header data structure, as explained above, and discussed with reference to FIG. 7 elements 165 and 166.

Lines 11-17 call an operation to define the parameters of the API that are included in a descriptor register set as described in Table 2.

Lines 20-21 call an operation to initialize a DMA memory mapped register for a channel utilizing the parameters of the API.

Line 23 calls an operation to initialize a specific DMA channel.

Lines 25-27 call an operation to prepare the initialized channel for compression operation, passing indicators of the locations of the compressed and uncompressed data sets, setting up the hardware registers, etc.

Lines 29-30 call an operation to cause execution of the compression operation according to the parameters of the API.

Lines 32-34 call an operation to prepare the initialized channel for decompression operation, passing indicators of the locations of the compressed and uncompressed data sets, setting up the hardware registers, etc.

Lines 36-37 call an operation to cause execution of the decompression operation according to the parameters of the API.

APAX compressed packets can be stored in non-persistent memory (SRAM, DRAM) as well as in persistent storage (flash, disk). In non-persistent memory, APAX DMA descriptors (typically also stored in SRAM or DRAM) provide the context for decompressing APAX compressed packets. In persistent storage, APAX DMA descriptors (stored with the thread's compressed packets) provide the same context.

Programs using the compression/decompression API can include logic to perform some aspects of memory management, as discussed below.

An APAX DMA Descriptor describes a single APAX compress or decompress transaction of one or more APAX packets. Using the APAX_CMD register, users can specify APAX compress or decompress transactions having:

as few as 32 samples (shortest packet length=32 samples×1 packet), or as many as $1.074 \times 10^9$ samples (longest packet length=65536 samples×16383 packets).

If needed because of system constraints (such as block-oriented thread processing), compression and decompression of large sample arrays can be divided into multiple APAX transactions, one transaction per block.

Programs can be configured for managing memory for compressed transactions using the standard C language library functions malloc and free. Alternatively, these functions can be included in the library files for the compression and decompression functions. For lossless compression, an application can be set up to allocate 10% more memory than the uncompressed input array requires. For instance, if the uncompressed input array contains 1M 32-bit floats (4 MB), the application should reserve 4.4 MB (via malloc) for the compressed array. For example, an application that uses the APAX API can include the following:

```
1    datatype *uncomp = (datatype
2        *)malloc(N_UNCOMP*sizeof(datatype));
3    int32 *comp = (int32
4        *)malloc(1.1*N_UNCOMP*sizeof(datatype));
```

This segment of code is then followed in the application by calls that use the API set of operations and parameters for compression and decompression, with reference to the allocated memory. The start address returned by malloc is copied to APAX_DEST register prior to the first APAX compress transaction. Subsequent APAX compress transactions auto-increment APAX_SRC and APAX_DEST registers so that by default, compressed packets will be stored consecutively in memory.

If the packets are saved to files on flash or disk (i.e. parameters that are not stored in each packet header), many relevant contextual fields (such as the uncompressed datatype, the packet length, and the APAX algorithm version number) are stored in compress DMA descriptors, several DMA descriptor fields must be stored with the compressed packets. A file format can be defined to support the API operations and hold API parameters.

Figure 7:
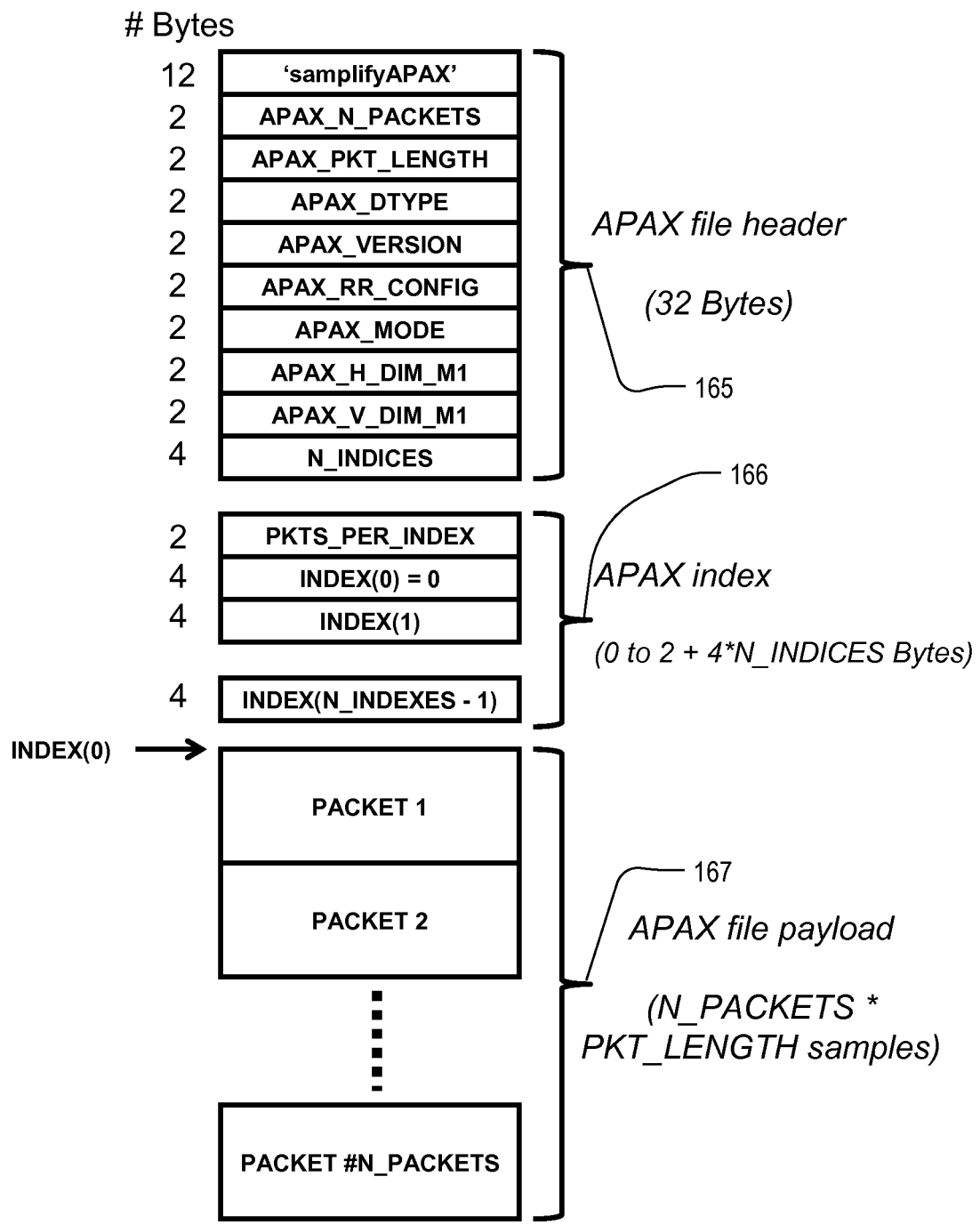
FIG. 7 illustrates a compressed file structure usable according to an API.

One such file format suitable for the APAX example is shown in FIG. 7. In this example, the format of a file includes a file header 165, a file index 166 (for indexed files), and a payload 167, and comprises a plurality of packets. The file header 165 corresponds to a descriptor register set and can be used by the decompression logic in the library functions, and can be written by the compression logic in the library functions. The index 166 is used for retrieving data within the compressed file, where random access may be needed. The payload 167 is organized into compressed packets in the APAX example. In a file system, a file created according to this format can be identified by <file name>.<file extension>syntax. For example, a file created according to this format could have a identifier like APAX_file.sfy, where the file extension ".sfy" is recognizable by the library functions. As described in this example and in FIG. 7, a .sfy file begins with the 12-byte ASCII string "samplifyAPAX" (12 characters).

The following DMA compress descriptor fields can be included in the APAX .sfy file header:
APAX_N_PACKETS (total number of packets in the compressed file)
APAX_PKT_LENGTH
APAX_DTYPE
APAX_VERSION
APAX_RR_CONFIG
APAX_MODE The APAX_MODE field can be used when a compressed file is appended (added to), so that the APAX compress block can determine what the APAX compression mode was, so that newly compressed packets can be APAX-compressed using those same parameters. Parameters that specify dimensions of two dimensional files can also be included, as well as a parameter indicating the number of indices supported in the file.

When APAX users desire random access to their compressed data, APAX compression provides random access by creating an index (directory) that points to the start of certain compressed packets. If random access is not desired, the .sfy field N_INDEXES=0 and the APAX index fields are not included in the .sfy file. When N_INDEXES>0, a parameter called PKTS_PER_INDEX indicates how many packets occur between index pointers. For instance, indexing every 64th packet (PKTS_PER_INDEX=64) of an 8192-packet file (APAX_N_PACKETS=8192) results in 8192/64=128 indices. PKTS_PER_INDEX is then followed by 128 64-bit pointers (8 Bytes per index). Index[0] points to the SYNC word of the first packet and always equals zero.

Application programs can perform compression and decompression using API compliant library functions that implement the parameter and operations of the API using the descriptors and file structures described above. An example using C language code illustrates how the API could be used in an application program for compression could comprise the following:

```
1   // compress stream example
2
3   APAX_Stream_Header *hdr;
4   // instantiated previously
5   // allocate buffers holding signal to be compressed
6   // and the compressed stream
7   // N_UNCOMP is the # of original samples
8   datatype *uncomp_base   = (datatype
9   *)malloc(N_UNCOMP*sizeof(datatype));
10  int32 *comp_base        = (int
11  *)malloc(1.1*N_UNCOMP*sizeof(int32));
12  Int32 *comp_base_save   = comp_base;
13  // comp_base will get incremented in the main loop
14  // allocate data structure that interfaces with HW
15  //(encapsulates memory mapped registers)
16  APAX_HW apaxHW = APAX_init(hdr, APAX parameter list);
17  APAX_initDMAchan(DMA_CHAN_C, &apaxHW);
18  // now march through signal, compressing nIndices of
19  // PKTS_PER_INDEX packets at a time
20  for (int indx=0; indx<nIndices; indx) {
21      // this call will update the pointers in the DMA
22      // descriptor
23
24      APAX_prep4sfy(indx,hdr,&apaxHW,uncomp_base,comp_base)
25      ;
26      // this call will compress some  # of packets, and
27      // return incremented pointers
28      APAX_compress(hdr-
29      >pktsPerIndex,&apaxHW,&uncomp_base,&comp_base);
30  }
31
32  // save .sfy file
33  NcompressedDwords = comp_base_save – comp_base;
34  fid = fopen('myFile.sfy', 'wb+');
35  fwrite(fid,   hdr, hdrsz);
36  // hdrsz was calculated previously
37  fwrite(fid,   comp_base_save, NcompressedDwords);
38  fclose(fid);
```

The portion of an application program just listed is commented, thus no further description is provided. This just listed application program segment includes calls to the operations of the API, explained above, that use the parameters of the API, along with memory management functions (e.g., malloc) that support the compression and decompression operations.

In implementations that do not include the hardware, or include only a part of the hardware needed to run the compression function, a library file can be called to execute all or parts of the compression operations using the parameters specified according to the API.

An example using C language code illustrates how the API could be used in an application program for decompressing an entire compressed file including all the compressed packets of the file, comprise the following:

```
1   // example of decompressing an entire stream
2
3   datatype *uncomp_base  = (datatype *)
4   malloc(N_UNCOMP*sizeof(datatype));
5   // parse the stream header to find out how large the
6   // stream is
7   fid = fopen('myFile.sfy', 'rb');
8   APAX_Stream_Header hdr;
9   fread(fid,  &hdr, sizeof(hdr));
10  // now we know the total # of packets but skip over
11  // "random-access" indices
12  fseek(fid, SEEK_SET, hdr.nIndices*sizeof(uint32));
13  // advance file pointer
14  uint32 tothdrbytes = fseek(fid, SEEK_SET, 0); //
15  returns current file offset
16  // alloc memory needed to hold ENTIRE compressed
17  // stream
18  int32 *comp_base = (int32
```

```
19    *)malloc(sizeof(int32)*(file_size(fid)-tothdrbytes));
20    // additional parameters come from stream header,
21    // probably
22    APAX_HW apaxHW = APAX_init(&hdr, additional
23    parameters);
24    APAX_initDMAchan(DMA_CHAN_C, &apaxHW);
25    // decompress the whole thing, one packet at a
26    // time...
27    for (pkt=0; pkt<hdr.npkts, pkt++) {
28
29    APAX_prep4dsy(pkt,&hdr,&apaxHW,comp_base,uncomp_base)
30    ;
31        APAX_decompress(1  /* # packets to decompress */,
32    &apaxHW,  &comp_base,  &uncomp_base);
33    }
```

An example using C language code illustrates how the API could be used in an application program for decompressing only selected parts of a compressed file including all the compressed packets of the file, comprises the following:

```
1     // random access decompress example
2
3     uint32 sampleNum, nSamples; // start sample & #
4     samples user wants to decompress (inputs)
5     // load APAX header from stream (file)
6     fid = fopen('myFile.sfy', 'rb');
7     uint16 hdrsz;
8     fread(fid, &hdrsz, sizeof(hdrsz));
9     byte *hdrmem = malloc(hdrsz);
10    // rewind the file pointer and read in the entire
11    // stream header (including indices)
12    fseek(fid,0,SEEK_SET);
13    fread(fid,hdrmem,hdrsz);
14    APAX_Stream_Header *hdr = (APAX_Stream_Header
15    *)hdrmem;
16    fread(fid, &tmpHdr, sizeof(tmpHdr));
17    // which group of packets contain the start sample?
18    pkt = sampleNum / hdr->pktLen;
19    index = pkt / hdr->pktsPerIndex;
20    // how many packets worth of samples has the user
21    // requested?
22    nPkts = ceil(nSamples/hdr->pktLen);
23    // how many total packets do we need to compress?
24    nPkts += pkt - index*hdr->pktsPerIndex;
25    // now we know enough to index into the compressed
26    // stream
27    offset = hdr->indices[index];
28    // how many compressed samples to read?
29    nsfy = hdr->indices[index + nPkts/hdr->pktsPerIndex]
30    - offset;
31    // read compressed samples from stream
32    int32 *comp_base = (int32
33    *)malloc(nsfy*sizeof(int32));
34    fseek(fid, offset*sizeof(int32),  SEEK_CUR);
35    // advance stream
36    fread(fid, comp, sizeof(int32)*nsfy);
37    // note allocation of nPkts worth of samples, will
38    // trim away after decompression
39    datatype *uncomp_base  = (datatype *
40    )malloc(nPkts*hdr->pktLen*sizeof(datatype));
41    // decompress
42    APAX_HW apaxHW = APAX_init(hdr, additional
43    parameters);
44    APAX_initDMAchan(DMA_CHAN_C, &apaxHW);
45    // decompress the whole thing, one packet at a
46    // time...
47    APAX_prep4dsy(pkt,hdr,&apaxHW,comp_base,uncomp_base);
48    APAX_decompress(nPkts, &apaxHW, &comp_base,
49    &uncomp_base);
50    // omitting trimming of extra samples we decompressed
51    APAX_decompress(nPkts, &apaxHW, &comp_base,
52    &uncomp_base);
```

The random access decompress example just listed contains a detailed example including lines 17-30, of how APAX file header parameters and the APAX index support sample-accurate random access into a .sfy file's compressed packet payload.

The three sample portions of application programs provided just above call operations of the API that use the parameters of the API. In addition, the operations can move data using the DMA logic in the memory controller between an uncompressed location (e.g. on-chip direct access memory or cache memory) on the same chip as a processor core, and a compressed location (e.g. DDR DRAM main memory) on a separate chip or chips.

Figure 8:
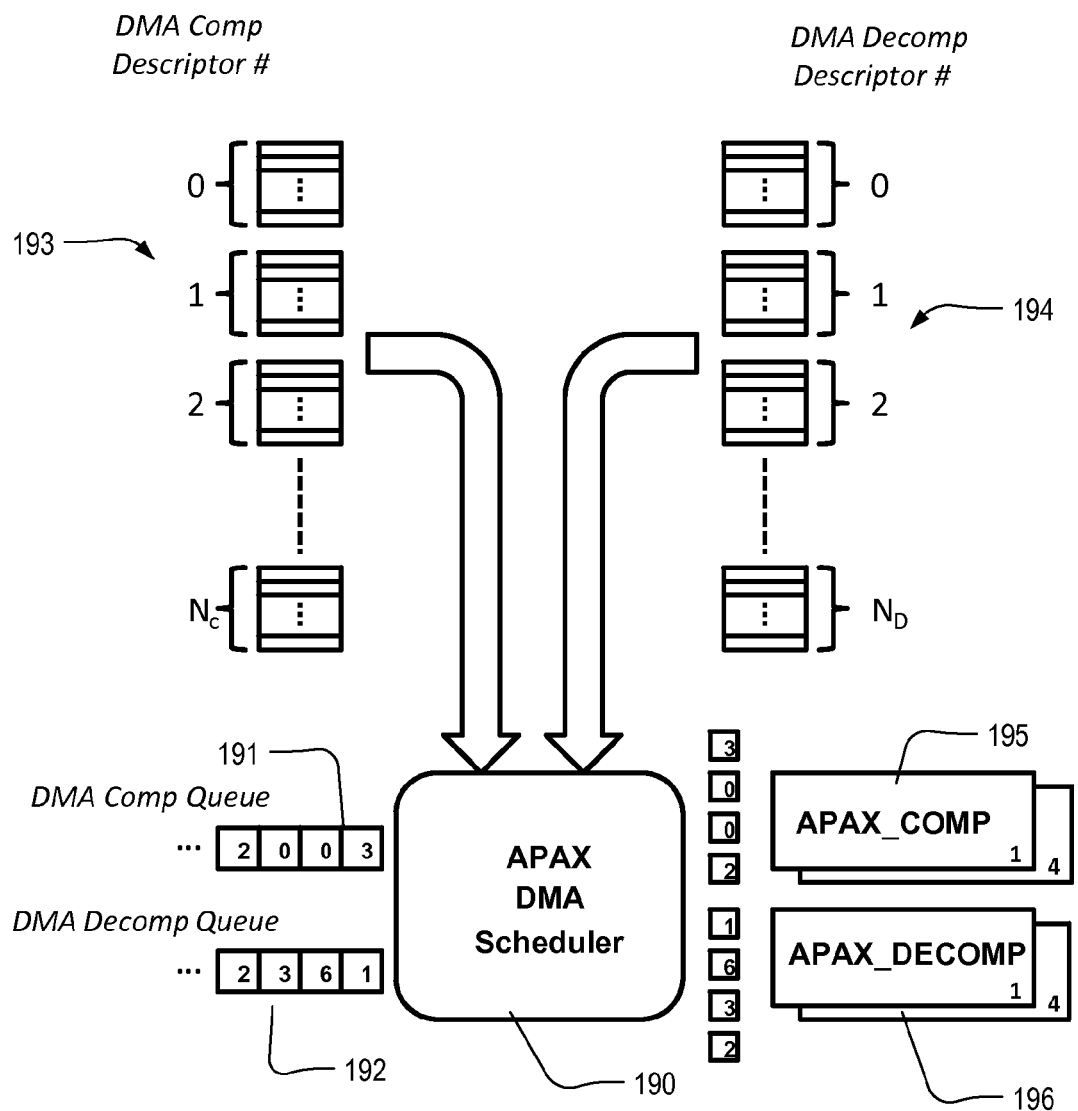
FIG. 8 illustrates logic for controlling and allocating compression and decompression logic in a system like that of FIG. 3.

As illustrated in FIG. 8, a module implemented as a library file for example, or by hardware, can be included for scheduling DMA operations using the descriptors described above. A basic DMA scheduler 190 can include a compression queue 191 and decompression queue 192, each of which includes a pointer to a corresponding compression descriptor from a set 193 including descriptors 0, 1, 2, . . . $N_C$, or a pointer to a corresponding decompression descriptor from a set 194 including descriptors 0, 1, 2, . . . $N_D$. As needed by the corresponding compression channel from the set 195 of compression channels, or corresponding decompression channel on the set 196 and decompression channels, the queues are delivered to the logic (whether implemented by hardware or software or both), according to the priorities established using the scheduler.

Figure 9:
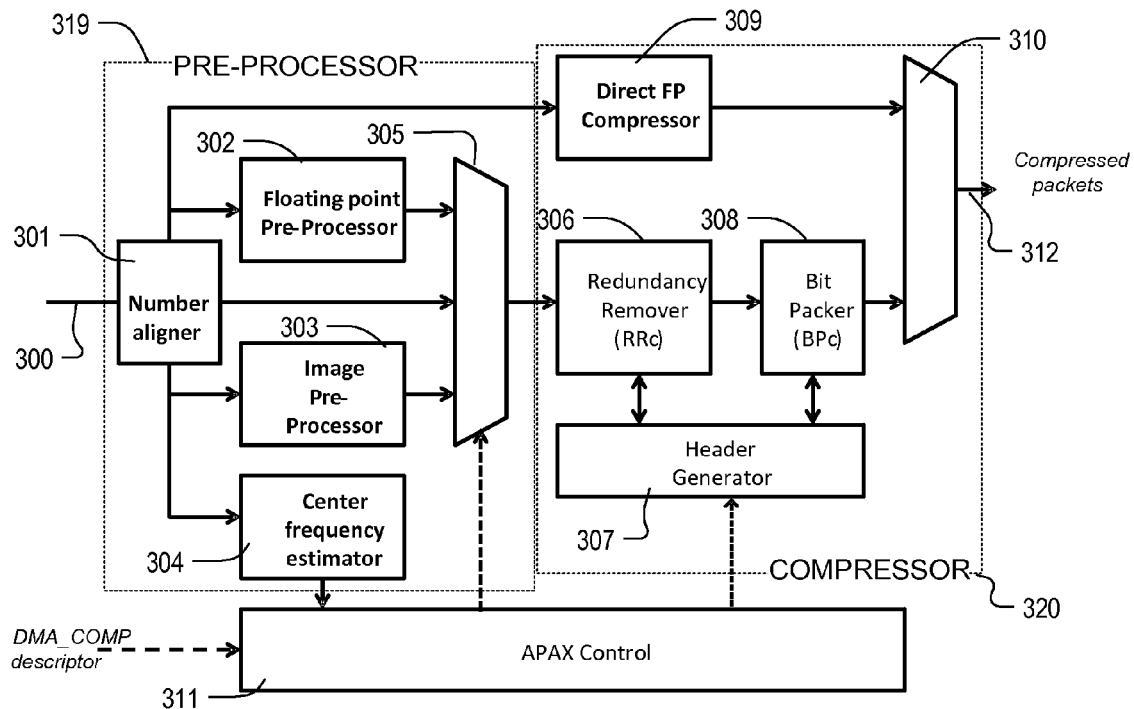
FIG. 9 is a block diagram showing engines used for compression operations of an API.

FIG. 9 is a block diagram of logic resources used for implementing APAX compression operations of an API like that described above. These resources can be implemented as one or more hardware accelerators, corresponding to blocks 195 for compression in FIG. 8, which are allocated to a data move operation and provided with the parameters of the API by a corresponding library function implemented by software. Alternatively, some or all of these resources of FIG. 9 can be implemented as software in a library file, and used in coordination with other components compliant with the API.

In general, the compression resources include a preprocessor block 319 and compressor block 320, with associated control 311. The preprocessor block 319 is adapted for a variety of different data types, including integer data, floating-point data and image data in this example. Data to be compressed are input as represented by line 300, and compressed packets are output as represented by line 312. In a hardware-accelerated environment, the lines 300 and 312 can correspond to on-chip registers or the data buses. In a software embodiment, lines 300 and 312 can correspond to the data read by or written by the processor that is executing library functions.

The preprocessor block 319 includes a number aligner 301 in embodiments including a hardware accelerator coupled to an internal bus on the integrated circuit. The number aligner 301 aligns samples to be compressed of one width with the internal bus, which may have a different width from that of the samples. In one example, an internal bus may be a 64-bit wide interface to DDR memory (DDR3), while the samples to be compressed are 16-bit integers. In this case, the number aligner 301 will map the data from the internal bus as follows:

DDR[63:48]=int16_sample[3]
DDR[47:32]=int16_sample[2]
DDR[31:16]=int16_sample[1]
DDR[15:0]=int16_sample[0]

In another example, an internal bus may be a 128-bit-wide bus, and the samples to be compressed may be 32-bit single-precision floating-point data. In this case, the number aligner 301 will map the data from the internal bus as follows:

DDR[127:96]=float32_sample[3]
DDR[95:64]=float32_sample[2]

DDR[63:32]=float32_sample[1]
DDR[31:0]=float32_sample[0]

The output samples, from the number aligner 301, are delivered on four alternative paths in this example. When delivered on a first path, the samples are delivered to a direct floating-point compression engine 309 which performs alternative types of lossy, floating-point compression explained in more detail below with reference to FIGS. 13 and 14. On a second path, the samples are delivered to a floating-point preprocessor block 302 which can perform such functions as floating-point to integer conversion, to enable compression using a compression engine designed for integer compression in compressor 320. On a third path, the samples are delivered directly to a selector 305. On a fourth path, the samples are delivered to an image preprocessor 303, which can perform a variety of functions unique to image file encoding, color space conversion, color space decimation, and the like. On a fifth path, the samples can be delivered to a center frequency estimator 304 which can be applied for sample streams that can benefit from a redundancy removal algorithm that depends on the center frequency of the sample stream. The output of the center frequency estimator 304 is applied to the control block 311, which utilizes the information in control of the compression process as discussed below.

More details concerning floating-point to integer conversion in the floating-point preprocessor 302, and representative functions for the image preprocessor 303 are discussed below.

As to center frequency estimation, the illustrated logic can support compression of data having different center frequencies. The center frequency estimator 304 determines a center frequency to be applied in redundancy removal as discussed below.

The inputs to the selector 305 include the output of the floating-point preprocessor 302, the samples delivered on the third path directly from the number aligner, and the output of the image preprocessor 303. The selector 305 selects the appropriate data stream based on parameters applied by the control block 311, which are determined from a descriptor compliant with the API delivered to the control block 311.

The compressor block 320 can include a plurality of alternative compression modalities. In this example, compressor block 320 includes two alternative compression modalities. The first modality is a floating-point lossy compression algorithm performed by the direct floating-point compression engine 309. The second modality is an integer compression algorithm that can be configured for lossless and lossy compression, in response to parameters provided in compliance with the API. The second modality performed using the redundancy remover 306, and a bit packer 308. A header generator 307 is included with the redundancy remover 306 and the bit packer 308 for use in the assembly of packets to be delivered on line 312, including the compressed data after redundancy removal.

The output of the direct floating-point compression engine 309, and the bit packer 308 are applied to an output selector 310, which provides the compressed packets on line 312.

The control block 311 receives a DMA_COMP descriptor, like that described above, controls the routing of the samples through the various logic blocks, and applies the parameters of the compression as needed to the various logic blocks. The control block 311 also controls an attenuation factor utilized in some compression modes, to control fixed rate or fixed quality operations, for example, those based on statistics fed back about the characteristics of compressed packets.

Figure 10:
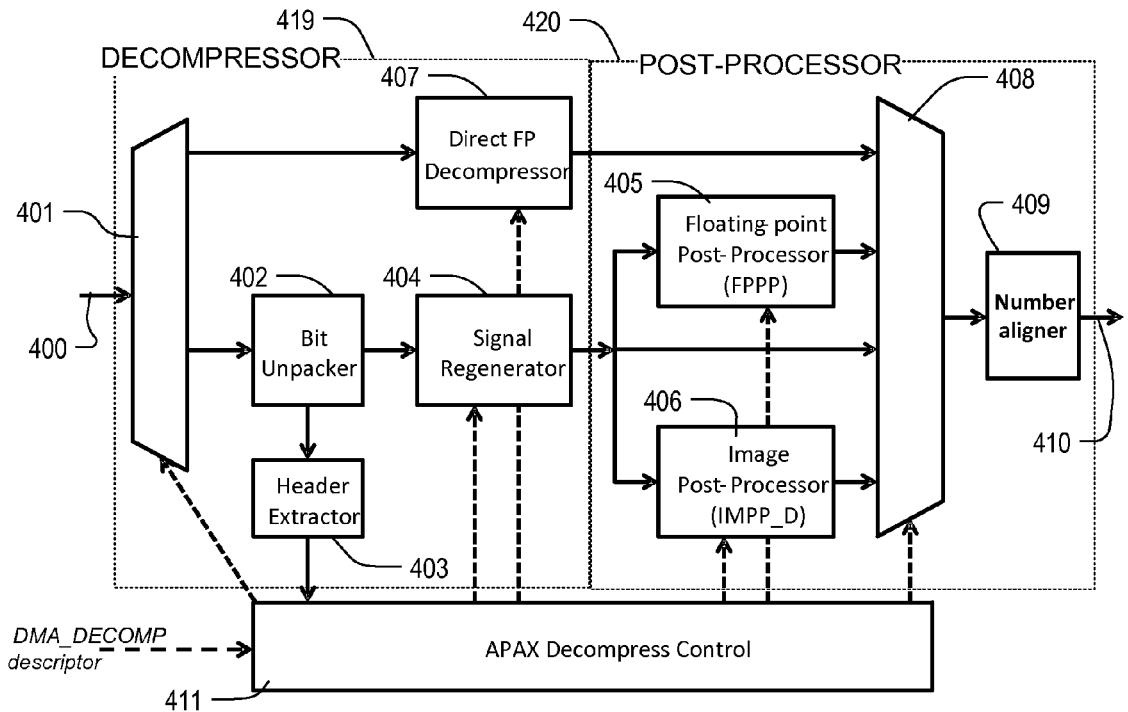
FIG. 10 is a block diagram showing engines used for decompression operations of an API.

FIG. 10 is a block diagram of logic resources used for implementing decompression functions compliant with an API like that above. These resources can be implemented as a hardware accelerator, corresponding to block 196 in FIG. 8, which is allocated to a data move operation and provided with the parameters of the API by a corresponding library function implemented by software. Alternatively, some or all of these resources of FIG. 10 can be implemented as software in a library file, and used in coordination with other components compliant with the API.

In general, the decompression resources are complementary to the compression resources described with respect to FIG. 9, and include a decompressor block 419, a postprocessor block 420 and a control block 411. Data packets to be decompressed are input as represented by line 400, and decompressed data are output as represented by line 410. In a hardware-accelerated environment, the lines 400 and 410 can correspond to on-chip registers or the data buses. In a software embodiment, lines 400 and 410 can correspond to the data read by or written by the processor that is executing library functions.

The decompressor block 419 includes a demultiplexer 401, which routes the incoming data packets either to the direct floating-point decompression engine 407, or to resources corresponding to the integer compression engine that included the redundancy remover 306 and bit packer 308 of FIG. 9. The demultiplexer is controlled by the decompress control logic 411, which implements the parameters specified according to the API. The decompression parameters may come from a file that conforms to the .sfy format described with FIG. 7, or may come from a DMA decompress descriptor previously described with FIG. 5 (element 162-A). In this example, those parameters are specified using a DMA DECOMP descriptor as described above. When the API parameters specify that the incoming data packets are direct floating-point compressed, then the packets are routed to the corresponding direct floating-point decompression engine 407. The control block 411 responds to the parameters specified according to the API to configure the direct floating-point decompression engine 407.

When the API parameters specify that the incoming data packets are compressed according to the alternative integer compression functions, then the packets are routed to the bit unpacker 402. In the bit unpacker, the headers of the packets are extracted and delivered to the control block 411. The parameters from the extracted packet header are used by the control block 411 to control the signal regenerator 404, as described in more detail below.

The output of the signal regenerator 404 is applied to an appropriate unit of the postprocessor block 420. Depending on the incoming datatype, the output of the signal regenerator 404 can be routed through the floating-point postprocessor 405, or through the image postprocessor 406. The postprocessor 420 includes a selector 408 controlled by the control logic 411, in response to the API parameters or parameters carried by the packets being decompressed. The inputs to the selector 408 include the output of the direct floating-point decompression engine 407, the output of the floating-point postprocessor 405, the direct output of the signal regenerator 404, or the output of the image postprocessor 406 in this example. The output of the selector 408 is then applied to a number aligner 409 (complementary to that discussed above connection FIG. 9), when necessary, to the output 410.

In light of the organization of the components shown in FIGS. 9 and 10, some details of the individual components of the compression and decompression functions are provided next.

The floating-point preprocessor 302 of FIG. 9 can comprise a "float to integer" format converter, in accordance with an embodiment of the floating-point pre-processor block can be understood as follows.

The float-to-integer format converter in floating-point preprocessor 302 may normalize a set of input floating-point numbers by dividing by a scale factor to form a set of normalized floating-point numbers. Normalization adapts the range of the fixed-point integer samples to the range of a particular set of input floating-point samples, thus preserving more accuracy in a fixed-point (integer) format. Alternatives for determining the scale factor for the set of input floating-point numbers include the following:

1) Determining the maximum magnitude value (both mantissa and exponent) of the floating-point numbers in the set, f_max, and determining the scale factor F_SCALE using the equation set out below,
2) Using the F_SCALE of a previous set of floating-point numbers for a current set, or predicting a maximum magnitude value for the current set based on that of one or more previous sets.

The first option for the scale factor produces scaled floating-point numbers where the maximum magnitude in the set is 1.0 or less, so that floating-point numbers in the set will have values in the range of {−1.0, +1.0}. The second option reduces the computational latency for the current set. After normalization, the float-to-integer format converter converts the scaled floating-point numbers to integer numbers.

The input floating-point data are represented in NB bits per sample. The number of bits per integer sample at the output is Nbits. A converter determines the maximum floating-point value for a set of input floating-point samples, f_max, and then computes a scale factor, F_SCALE, as follows:

$$F\_SCALE=[2^{(Nbits-1)}-1]/f\_max$$

The resulting value F_SCALE can be multiplied with each floating-point number in the set by to form a scaled floating-point number. Logic then rounds each scaled floating-point number to provide the output integer number. The integer number can be represented in a binary 2's complement format having Nbit bits. The 2's complement integer format is used for illustrative purposes. The particular integer format does not limit the scope of the invention, as the floating-point data may be converted to other integer formats.

In an alternative embodiment, which can reduce the computational latency for the current set, the float-to-integer format converter in the floating-point preprocessor 302 determines the maximum exponent value of the floating-point numbers in the set. For this alternative, the float-to-integer format converter may provide approximate normalization during format conversion, without a multiplication by the floating-point scale factor F_SCALE. This reduces computational complexity by eliminating the floating-point multiplier. The approximate normalization provides magnitude values less than 2.0 for the set. Alternatives for determining the maximum exponent value for the set include the following:

1) Determining the maximum magnitude exponent value, EXP_SCALE, of the floating-point numbers in the set and providing the EXP_SCALE to the float-to-integer format converter,
2) Using the maximum magnitude exponent value of a previous set of floating-point numbers for a current set, or
3) Predicting a maximum magnitude value f_max for the current set based on that of one or more previous sets and calculating F_SCALE based on the predicted f_max.

A float-to-integer format converter according to an alternative embodiment operates as follows. For this embodiment, the sign bit, exponent bits and mantissa bits of each floating-point number are separately processed to produce an integer in 2's complement format. For IEEE 754 single precision format, the mantissa has NM=23 bits and the exponent has NE=8 bits. For IEEE 754 double precision format, the mantissa has NM=32 bits and the exponent has NE=11 bits. The converter sets a "hidden bit" to "1" for the integer mantissa, that corresponds to the leading "1" of the integer mantissa. The resulting mantissa may provide a positive mantissa, "pos_mant". In 2's complement format, a negative number may be represented by inverting the bits of the positive mantissa and adding "1". Then, the converter inverts the bits of the positive mantissa and adds "1" to the inverted bits to provide a negative mantissa, "neg_mant". The sign value, pos_mant and neg_mant are provided to logic that selects pos_mant if the sign value is "0" or neg_mant if the sign value is "1". The resulting selected mantissa is input to right shifter, where the mantissa bits are shifted by a number of positions based on the exponent value, "exp," of the input floating-point number, or alternatively, by the difference of exp and EXP_SCALE. The shift increment corresponding to the exponent value shifts the mantissa bits to the corresponding bit locations for the integer representation. The shift increment corresponding to EXP_SCALE provides the approximate normalization by the value EXP_SCALE, as described above. Alternatively, when the floating-point number has already been scaled by F_SCALE, the EXP_SCALE value need not be used. In this case, the exponent value "exp" determines the number of right shifts for pos_mant or neg_mant. A shifter provides the 2's complement integer representation having Nbits per sample.

The image preprocessor 303 is used for handling image datatypes. For example three imaging datatypes may include:
Red-Green-Blue (RGB)
Intensity & Chroma (YUV)
Image sensor pixels (Bayer matrix)

These imaging datatypes are a special integer sub-type. In many imaging subsystems, RGB, YUV, and Bayer matrix samples are stored as interleaved N-bit integers, where N=8, 10, 12, or 16. In one example, the image preprocessor can perform conversion between RGB and YUV imaging datatypes by averaging color components; for instance:
RGB→YUV: Y=0.299R+0.587G+0.114B
U=−0.147R−0.289G+0.436B
V=0.615R−0.515G−0.100B
YUV→RGB: R=Y+1.140V
G=Y−0.395U−0.581V
B=Y+2.032U Also, the pixels represented by an image file can be arranged in different orders to facilitate compression. For example, the image preprocessor can perform rearrangement in an RGB image, so that the individual R, G and B pixels can be organized into separate streams for compressed, and upon decompression, re-interleaved to form the input stream form.

A variety of other preprocessing functions, including handling decimation of YUV format so-called 4:4:4 image data to 4:2:2 and 4:2:0 decimated image files, can be implemented as hardware assisted library files, or software only library files, and specified using an API. See, my co-pending U.S. patent application Ser. No. 13/358,511, filed on 25 Jan. 2012, entitled RAW FORMAT IMAGE DATA PROCESSING, which is incorporated by reference as if fully set forth herein.

The center frequency estimator 304 in the compression system of FIG. 9 is utilized for determining the center frequency of one-dimensional input signals (ints, floats, or images). As described in U.S. Pat. No. 7,009,533, issued 7

Mar. 2006, entitled Adaptive Compression and Decompression of Bandlimited Signals, which is incorporated by reference as if fully set forth herein and describes operations and parameters than can be included in an API, the sample spacing and the addition or subtraction operations may be selected to optimally compress the samples based on their center frequency. This value is utilized by the redundancy remover as described in more detail below. Typically two-dimensional input data will not exhibit a center frequency. So, for this and other data types and applications, the center frequency estimator 304 may not be needed, and the control values can be specified using the API in the previously described APAX_RR_CONFIG register of FIG. 6. When the center frequency estimator 304 is enabled, it can determine for example a center frequency as falling into one of six bins: DC, fs/8, fs/6, fs/4, fs/3, or fs/2, where fs is the sampling frequency. These bins determine (for one-dimensional input signals) the STRIDE1, STRIDE2, FIFO2_SEL and ADD_SUB values (described below with reference to FIG. 11, that control the redundancy remover and add/subtract elements. The center frequency estimator 304 can be configured to operate over a programmable number of input samples (such as 256 or 1024) and counts the number of positive-going zero crossings in the input signal, after any DC offset is removed.

Each of the functions of the hardware accelerator shown in FIG. 9 and FIG. 10 can be implemented as a software component of a library used to implement the API, can be implemented solely in hardware with a supporting operation in the API library for initializing and allocating the hardware, or can be implemented by a combination of software and hardware. The resources used to implement these functions, whether in hardware, software or a combination of hardware and software can be referred to as "engines" which implement the operations specified in the API.

For the embodiment in which the data move operation moves data between a compressed off-chip memory to an uncompressed location on the same chip as a processor core used by application programs, functions which consume greater processing resources are preferably implemented in hardware, including for example a bit packer 308 and bit unpacker 402. Also, the image preprocessor 303 and image postprocessor 406, which can implement color space conversion and YUV decimation processes, are preferably implemented in hardware. Likewise, the redundancy remover 306, which in this example is configured to monitor three separate streams for the purposes of determining which uses the fewest bits, is preferably a hardware implemented function. The signal regenerator 404 might be a software function that is assisted by hardware performing operations using software after the bit packer has recovered the mantissas of the floating-point samples to integrate the mantissas back to the original signal samples. This hardware assisted implementation of the signal regenerator 404, is suitable particularly where the underlying platform supports add functions used for integrating these values. Also, the floating-point to integer converter in the floating-point preprocessor 302 and the integer to floating-point converter in the floating-point postprocessor 405, could be hardware assisted functions as many hardware platforms already include hardware support for these functions. Software-only functions could comprise the locate operation that is used for accessing samples in compressed packet sets, given a compressed ".sfy" file the function could operate most parameters that indicate a starting sample S1 and a number of samples N1, and output the identified packets along with values that indicate which samples to discard from the beginning packet's decompressed output samples, in which samples to discard from the ending packet's decompressed output samples. Also, the direct floating-point compression engine 309 and direct floating-point decompression engine 407 are functions that could be readily implemented using software.

Of course, allocation of hardware and software resources to the operations to be executed by the API depends on the particular implementation details and design goals, including the characteristics of the underlying hardware platform, the variety of operations to be executed, and so on.

Figure 11:
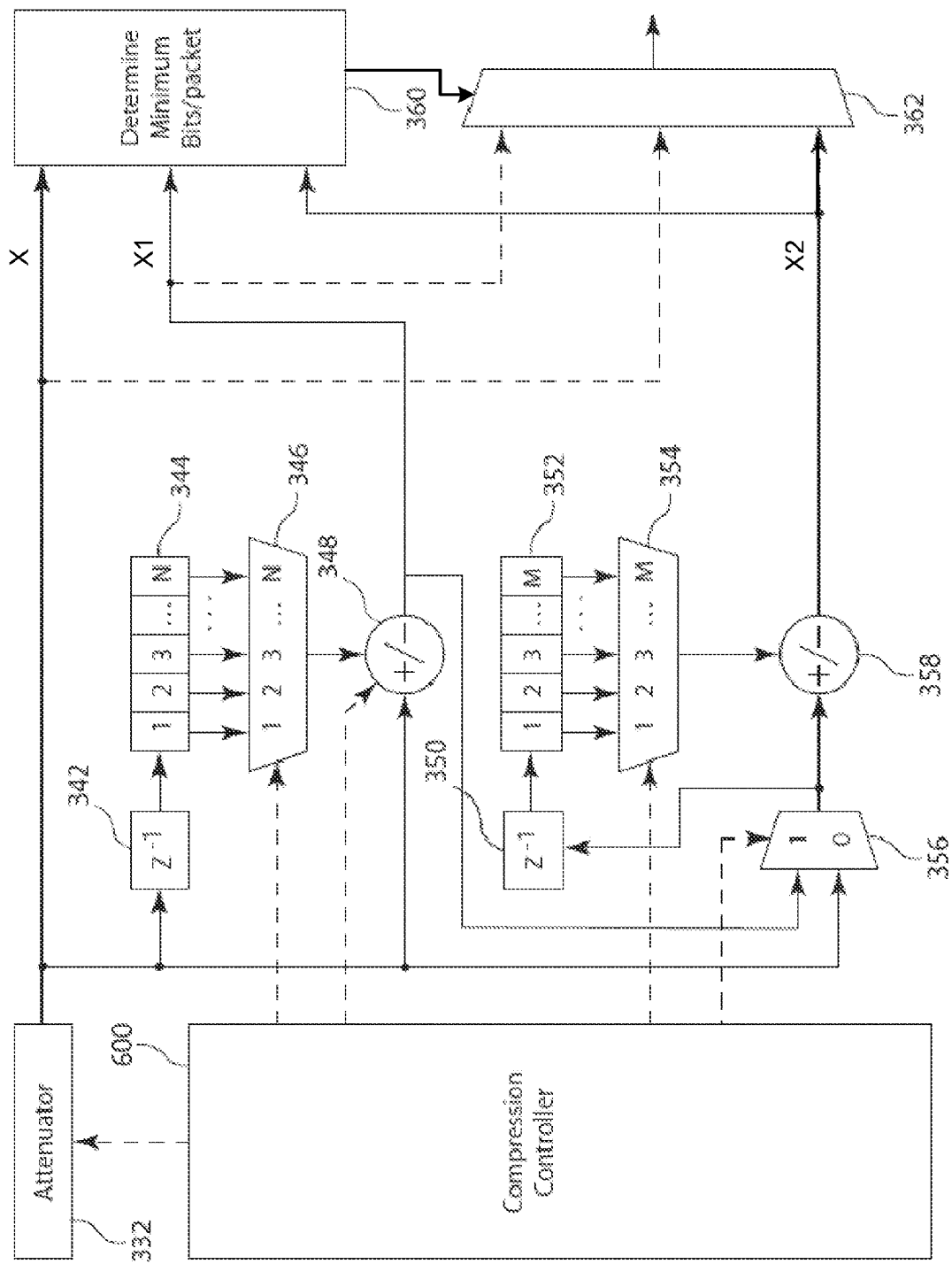
FIG. 11 illustrates a redundancy removal engine, with an attenuator and control suitable for use in a system like that of FIG. 9.

FIG. 11 illustrates an adaptive architecture for the redundancy remover 306 of FIG. 9, with an attenuator, as used in one example system for integer compression. This architecture is configurable to perform sums or differences between samples with selectable sample spacings and to determine the sample, sample difference/sum or derivative order providing the minimum bits per packet, or best compression. The attenuator 332 may attenuate the integer sample x(n) by an attenuation factor indicated by the compression controller 600 (corresponding with controller 311 in FIG. 9) or no attenuation may be indicated. For the following description, the variable x(n) represents the integer sample with or without attenuation. The FIFO buffer 344 stores N previous samples x(n−1) to x(n−N), where the delay element 342 provides x(n−1). The selector 346 selects a sample x(n−m) with the desired sample separation from the FIFO buffer 344. The add/subtract element 348 computes the sum or difference between the current integer sample x(n) and the selected sample x(n−m) to form a first result $x_1(n)$. If add/subtract element 348 is set to subtract, the result $x_1(n)$ represents a first derivative. When the sample spacing index m=1, the result $x_1(n)$ is the first derivative of adjacent samples. When the third selector 356 is set to "1", the first result $x_1(n)$ is delayed by a second delay element 350 to form $x_1(n-1)$ and provided to a second FIFO buffer 352. The second FIFO buffer 352 may store up to M samples of $x_1$ from $x_1(n-1)$ to $x_1(n-M)$. The second selector 354 selects a sample $x_1(n-p)$ from the second FIFO buffer 352 for input to the second adder/subtractor 358. The third selector 356 provides the other input to the adder/subtractor 358. When the third selector 356 is set to "1", the sample $x_1(n)$ is input to the second adder/subtractor 358. When the second adder/subtractor 358 is configured to subtract, the result is the second derivative $x_2(n)=x_1(n)-x_1(n-p)$. When the sample spacing indices are m=1 and p=1, the resulting $x_2(n)$ is the second derivative over adjacent samples. The fourth selector 362 selects the alternative using the fewest bits for the previous packet and provides the respective sample x(n), $x_1(n)$ or $x_2(n)$ to the block floating-point encoder in the bit packer 308. Alternatively, the selector 362 may use a manually-set selection parameter received from the compression controller 600. The FIFO buffers 344 and 352 store N and M samples, respectively. The sizes N and M may be set to accommodate compression calculations for a range of data formats.

The center frequency from the estimator 304, or provided using a configuration parameter according to an API, can be indicated as a fraction of the sample rate SR. A sample separation parameter may be used by selectors 346 and 354. The selection parameter for the third selector 356 is set to "1" for calculating second order derivatives. The add/subtract configurations apply to both adder/subtractors 348 and 358. The selection of addition or subtraction is related to the positive or negative correlation of the samples separated by the sample separation parameter corresponding to the center frequency.

The block 360 includes logic to determine which of alternatives x(n), x1(n) or x2(n) for the current packet would produce the least number of bits, or most compression. The alternative with the most compression is provided to the fourth selector 362 to be applied to samples for the next packet and stored in the packet header of the next packet. Determining the selection for the next packet based on the current packet data reduces the latency of compression processing. Alternatively, the selection of x(n), x1(n) or x2(n) may be made during a training period and fixed for subsequent packets. When the compression processing uses the block floating-point encoder in the bit packer 308, the block 360 logic may determine which of the alternatives x(n), x1(n) and x2(n) produces the most compression as follows:

1) For each $i^{th}$ block of N_GROUP samples for a packet, determine the maximum exponent (base 2), or n_exp(i) for each alternative x(n), $x_1$(n) and $x_2$(n),
2) Sum the n_exp(i) for all the blocks for a packet to form a total for each alternative, and
3) Select the alternative corresponding to the lowest total.

While the above does not explicitly calculate the exact number of bits per compressed packet for each alternative, the alternative producing the best compression is indicated by the lowest total. Alternatively, the maximum magnitude sample, max(i), in each block N_GROUP samples for each alternative can be substituted for n_exp(i).

The configurable compressor supports compression of multidimensional data structures or multiplexed data structures. Certain parameter settings for the components in FIG. 11 are appropriate for compression for two-dimensional (2D) data, such as image samples. For example, let N equal the number of samples representing a row of a 2D data set (or an image) so that a sequence of the integer samples x(n) represents row-ordered samples of two or more rows of the 2D data set, where x(0) to x(N−1) is the first row, x(N) to x(2N−1) is the second row, etc. When the first selector 346 is set to select x(N) and the first adder/subtractor 348 is configured to subtract, the resulting x1(n)=x(n)−x(n−N) is the difference between samples in adjacent rows.

When the second selector 354 is set to select "1", the third selector 356 is set to select "0", and the second adder/subtractor 358 is configured to subtract, the resulting x2(n)=x(n)−x(n−1) is the sample difference within the same row. The fourth selector 362 would select the input sample x(n), the row difference sample x1(n), or the sample difference x2(n) for block floating-point encoding. For multiplexed data, a sequence of samples x(n) may represent multiple channels of data, such as data from multiple sensors, multiplexed together to form the sequence. For example, N may represent the number of multiplexed channels, where x(n) to x(n−N+1) represent one sample from each channel at a given time instant and x(n−N) represents two temporally consecutive samples from the same channel. When the first selector 346 is set to select x(n−N) and the first adder/subtractor 348 is configured to subtract, the resulting x1(n)=x(n)−x(n−N) is the difference between temporally consecutive samples from the same data channel. When the second selector 354 selects samples from a second channel offset from the first channel and the second adder/subtractor 358 is configured to subtract, the difference x2(n)=x(n)−x(n−p) is the difference between two different channels at a given time instant. The difference between channel data may provide compression when the different channels are correlated. The selector 362 would select the input sample x(n), the intra-channel difference x1(n), or the inter-channel difference x2(n) for block floating-point encoding.

The bit packer 308 of FIG. 9, defines blocks of N_GROUP samples to be encoded together. The bit packer 308 applies a block floating point encoding to the redundancy-removed integer samples output from the redundancy remover 306. Aspects of block floating point encoding is described in my copending U.S. patent application Ser. No. 12/605,245, filed 23 Oct. 2009 entitled "Block Floating Point Compression of Signal Data" (now Pub. No.: US 2011/0099295 A1), which is incorporated by reference as if fully set forth herein. In the following description of the bits packer 308, "sample" refers to an integer type sample, an "exponent" of an integer sample will refer to the place value of the most significant (or leftmost) "1" in the integer's mantissa, or exponent (base 2), and "mantissa" will refer to the integer sample's mantissa. For the N_GROUP samples, the maximum exponent is encoded and the N_GROUP mantissas are encoded according to the following steps.

For the first group of N_GROUP samples:
1) Determine the exponent (base 2) for the sample with the maximum magnitude, such as by calculating the $\log_2$ of the maximum magnitude in each group of N_GROUP samples. This indicates the number of bits per encoded sample, or n_exp(0).
2) Absolute encode the exponent n_exp(0) of the first group using S bits, where S is the original number of bits per sample.
3) Encode the N_GROUP samples using n_exp(0) bits per sample.
4) For the ith group (i>0) of N_GROUP samples 401i:
Determine the $i^{th}$ exponent (base 2) for the sample with the maximum magnitude, which indicates the number of bits per encoded sample in the $i^{th}$ group, or n_exp(i);
Differentially encode the $i^{th}$ exponent by subtracting n_exp(i) from n_exp (i−1) to determine an $i^{th}$ difference value. Encode the $i^{th}$ difference value using a corresponding token, where shorter tokens represent more common difference values and longer tokens represent less common difference values.
Encode the $i^{th}$ group of N_GROUP samples using n_exp (i) bits per sample.

For the first group of samples, the exponent n_exp(0) is directly encoded. For example, the exponent n_exp(0) can be encoded as follows, where S is the original number of bits per sample:

| | |
|---|---|
| a. 0: | n_exp(0) = 0 (all 4 sample values are zero) |
| b. 1: | n_exp(0) = 2 (2 bits per sample) |
| c. 2: | n_exp(0) = 3 (3 bits per sample) |
| d. etc. until S-1: | n_exp(0) = S (S bits per sample) |

For the ith group, the exponent n_exp(i) may be differentially encoded using a prefix code, where no codeword is the prefix of another codeword. An example of differential encoding is as follows:
1. Calculate difference: e_diff=n_exp(i)−n_exp(i−1)
2. Encode e_diff as follows:

| | |
|---|---|
| a. 0: | e_diff = e(i) − e(i − 1) |
| b. 101: | e_diff = +1 |
| c. 110: | e_diff = −1 |
| d. 1001: | e_diff = +2 |
| e. 1110: | e_diff = −2 |
| f. Etc. | |

Huffman encoding of the exponent differences assigns tokens of different lengths to the exponent differences based on their frequencies of occurrence. Shorter Huffman tokens may be assigned to the more frequent values of exponent differences. The exponents n_exp(i) may be directly encoded, for example by Huffman encoding, instead of being differentially encoded. Alternatives for encoding the block exponents are described below. The bit packer 308, and other arrangements for assembling packets of compressed data, can be supported by library functions compliant with the API.

Figure 13:
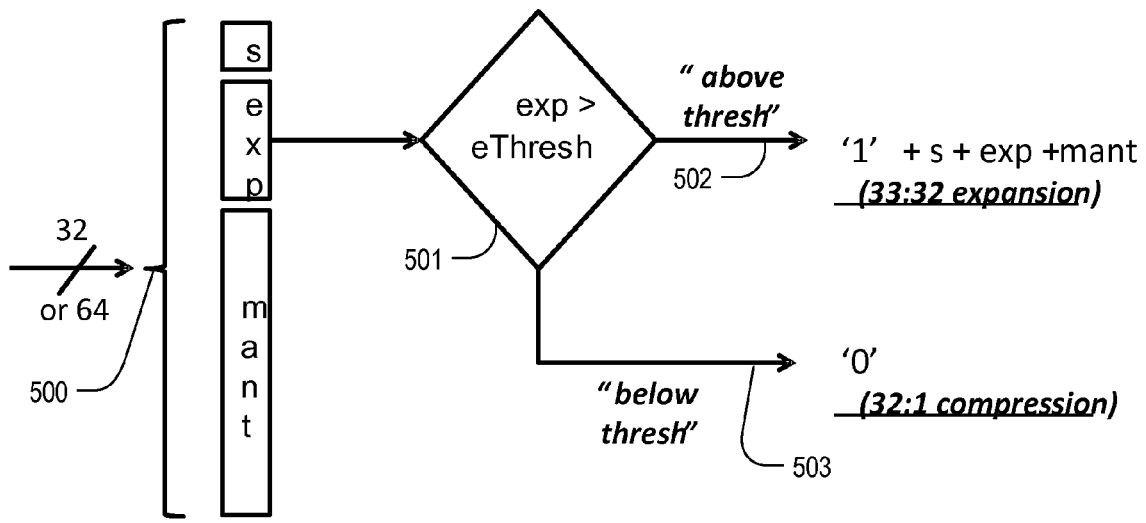
FIG. 13 illustrates a floating-point bin compression algorithm.
Figure 14:
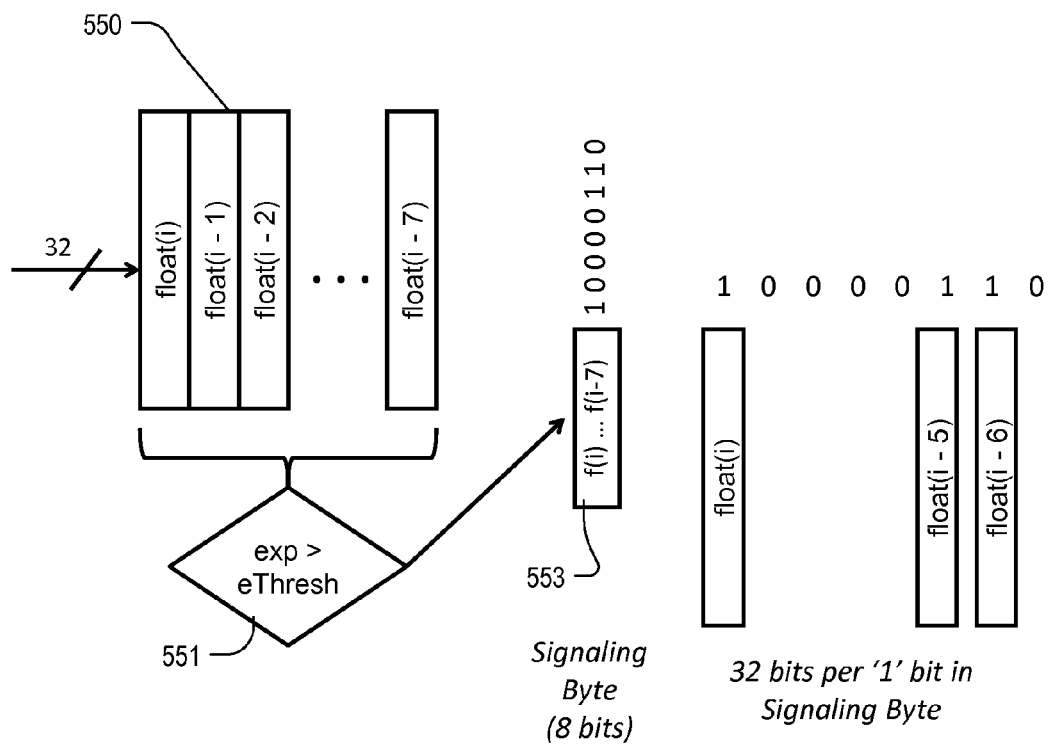
FIG. 14 illustrates a format for packets compressed using the algorithm of FIG. 13.

FIGS. 13 and 14 illustrate floating-point bin compression alternatives performed in which the direct floating-point compression engine 309 provides an alternate compression function, or functions, that can be implemented in a manner compliant with an API. In one embodiment, a two bin process (FP2) and a four bin process (FP4) are available in the library, and can be supported by the hardware. Other direct floating point algorithms can be applied as well.

The output compressed packets represent PKT_LENGTH uncompressed integers or floating-point values. Packet header fields describe parameters whose value could change with every packet or every few packets. When an APAX packet carries compressed 32-bit or 64-bit floating-point values, the first 32 bits of each packet header are followed by the floating-point maximum exponent found in this packet, stored in the 16-bit MAX_EXP field. APAX packet headers thus contain either 32 or 48 bits. Table 5 summarizes the contents of APAX packet headers.

6.4-format expresses attenuation values for up to 64 integer bits, although the APAX hardware could only support a 32-bit internal bit width (except for the float-to-int converter, which converts 64-bit floats to 32-bit ints). The four fractional ATTEN bits (0.4) are used as a 4-bit address into a 16-entry lookup table that contains a 16-bit integer multiplier. Each entry in the lookup table represents a 0.375 dB increment, although the 16-bit lookup table values are calculated on a linear scale. The resulting attenuation value is applied by the attenuator 332.

The STRIDE1 parameter specifies the FIFO delay or sample distance where the APAX Redundancy Remover finds the most similar recent sample, i.e. that sample most similar to the current sample. The STRIDE1 parameter corresponds to the sample separation used by the selector 346 in FIG. 11.

The ADD_SUB bit controls the operation of the two APAX Redundancy Remover adder/subtractors 348 and 358 in FIG. 11 (0=subtract, 1=add). The DERIV field indicates which stream (1 of 3) is contained in this compressed packet:

DERIV=0: original input samples or attenuated samples
DERIV=1: output of adder/subtractor 348 (associated with RR FIFO 344)

TABLE 5

Packet Header Contents

| APAX Packet Bits | Field Name | Field Value | Notes |
| --- | --- | --- | --- |
| PKT_HDR[11:0] | SYNC | 0x97F | SYNC word: [11:8] = 0x9 [7:4] = 0x7 [3:0] = 0xF |
| PKT_HDR[21:12] | ATTEN | 10-bit 6.4 format | 6 integer bits (0 . . . 64-bit shift) [21:16] 4 fractional bits [15:12]: 6 dB/16 = 0.375 dB per fract. bit |
| PKT_HDR[24:22] | STRIDE1* | 1, 2, 3, 4, 6, N | Redundancy Remover Stride: 0 → 1, 1 → 2, 2 → 3, 3 → 4, 4 → 6, 5 → RR_N_FIFO, 6-7: reserved |
| PKT_HDR[25] | ADD_SUB | 0 or 1 | Redundancy Remover add/sub control: 0 = subtract 1 = add |
| PKT_HDR[27:26] | DERIV | 0, 1, or 2 | Redundancy Remover deriv (0, 1, 2) 3: reserved |
| PKT_HDR[29:28] | INT_OR_FLOAT | 0, 1, or 2 | 0: int 1: 32-bit float 2: 64-bit float If INT_OR_FLOAT > 0, MAX_EXP is included in each packet header 3: reserved |
| PKT_HDR[30] | PKT1_IN_FRAME | 0 or 1 | When DTYPE = RGB, YUV, Bayer, or other 2-dim data, PKT1_IN_FRAME is set (=1) when the packet is the first in a 2D frame. Otherwise it's clear = 0. |
| PKT_HDR[31] | CRC32_FLAG | 0 or 1 | 32-bit CRC sent after each payload (0 = no CRC32, 1 = CRC32 present) |
| PKT_HDR[47:32] | Optional MAX_EXP | (ONLY for floats!!) | 8- bit or 11-bit max floating-point exponent (stored in a 16-bit int) |
| (APAX payload) : PKT_CRC[31:0] | : Optional CRC32 | : | : CRC32 checksum per packet - includes all 32-bit compressed words from SYNC pattern to last 32 bits of the compressed payload. |

Each APAX-compressed packet can be aligned on 32-bit doubleword (4-Byte) boundaries. Aligning successive compressed packets allows detection of mis-synchronization of compressed packets. Each packet header begins with a 12-bit SYNC word at PKT_HDR[11:0], allowing the APAX decompressor to detect if any of the previous packet's variable-length packet fields are incorrectly decoded. Since all packets begin on a 32-bit double word boundary, and begin with the 12-bit value 0x97F, this allows the detector to both detect synchronization errors and to re-synchronize the compressed packet stream, based on identifying the 0x97F SYNC word in the proper Dword-aligned location.

The nine-bit ATTEN field (PKT_HDR[21:12]) specifies six integer and four fractional attenuation settings. APAX's DERIV=2: output of adder/subtractor 358 (associated with RR FIFO 352).

The INT_OR_FLOAT bit indicates whether the MAX_EXP field (16 bits) is included in the APAX packet header. When INT_OR_FLOAT=0 (integer input datatypes), MAX_EXP is not sent and the packet header contains just 32 bits. When INT_OR_FLOAT=1 (floating-point input datatypes), MAX_EXP carries the maximum exponent as a 16-bit signed integer value (total of 48 bits in the packet header).

PKT1_IN_FRAME (PKT_HDR bit [30]) is set (=1) when the packet contains the first samples or color components in a two-dimensional frame, such as for RGB, YUV or Bayer-encoded images or video. For one-dimensional samples and for packets other than the first packet in a 2D frame, PKT1_IN_FRAME should be clear (=0).

PKT_HDR bit [31] indicates whether the packet payload is followed by a CRC-32 checksum.

After the packet payload, a PKT_CRC[31:0] OPTIONAL field (enabled via the APAX_GEN_CRC32 bit) can be included, whose presence after the packet payload is indicated by a "1" in CRC32_FLAG (PKT_HDR[31]). The CRC-32 checksum can be generated for example on the following packet values:

CRC-32 start location: at SYNC word in packet header, PKT_HDR[11:0]

CRC-32 end location: including the final 32-bit compressed payload Dword

The same library component or a different library component can control data transfers using the acceleration logic as initialized.

Turning to more details of the decompression resources represented by FIG. 10, the decompressor decodes a stream of APAX compressed packets by first accessing the APAX control parameters in the APAX_COMP DMA transaction (which can also be stored in the .sfy file header), and then by accessing additional APAX control parameters (such as ATTEN, DERIV, STRIDE1, etc.) in each APAX compressed packet header as described in Table 5 above. The APAX decompressor performs the converse operation of the APAX compressor, generating the identical or substantially similar samples that the APAX compressor originally received.

The bit unpacker 402 in the decompression resources of FIG. 10 parses the header associated with each compressed packet, and applies the parameters from the packet header and file header to recover the sequence of integers encoded by the packet. The integers are then applied to the signal regenerator, for a final stage of decompression, and then any applicable post processing.

The direct floating-point decompression engine 407 receives the bin compressed packets, and reconstitutes floating-point values for each sample, in a manner discussed below with respect to FIGS. 13 and 14.

Figure 12:
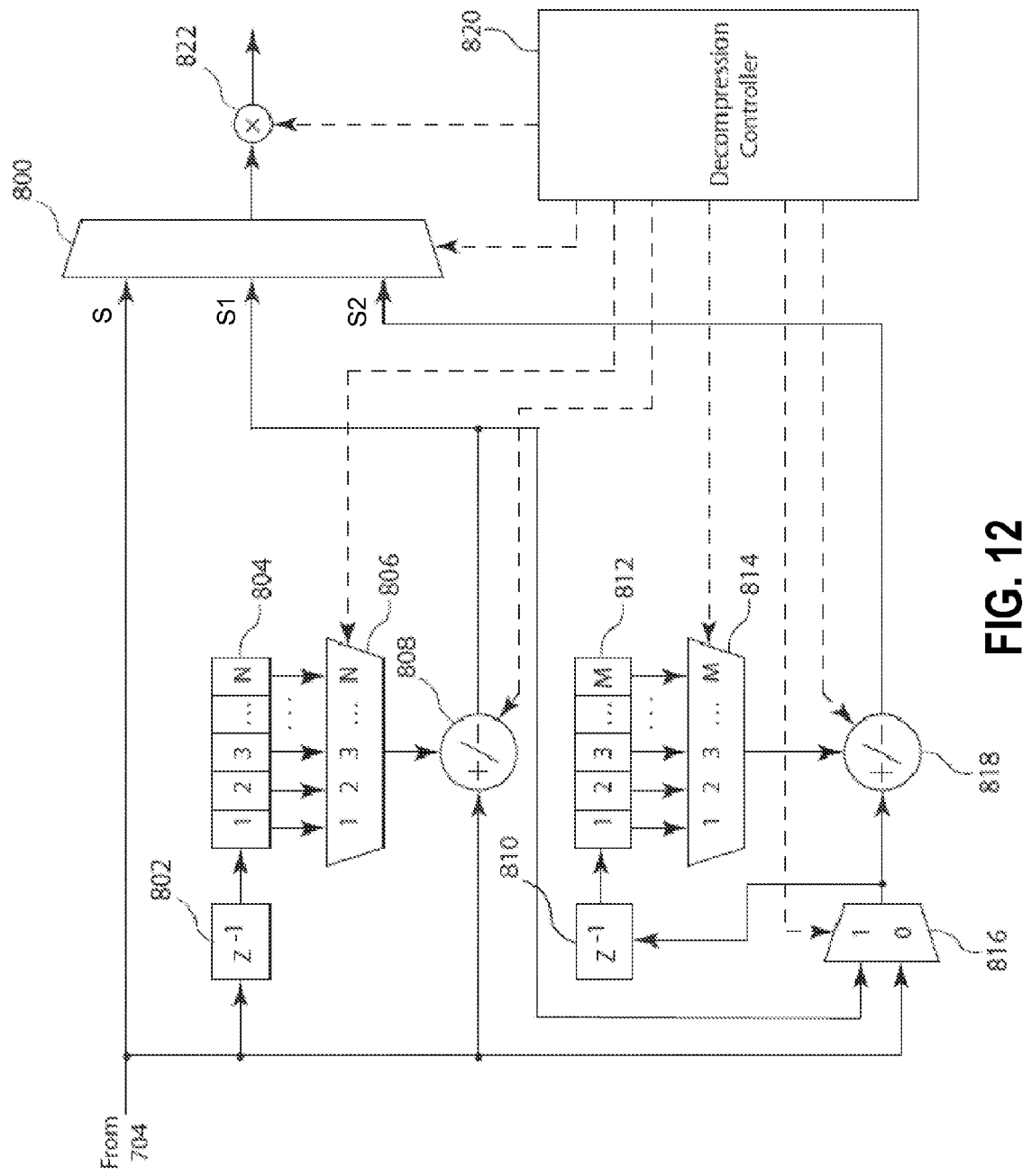
FIG. 12 illustrates a signal regenerator complementary to the redundancy removal engine of FIG. 11, for use in a system like that of FIG. 9.

FIG. 12 illustrates an adaptive architecture for the integer decompression signal regenerator 404 of FIG. 10, complementary to that shown in FIG. 11. The configurable signal regenerator 404 performs sums or differences between decoded samples separated by selectable sample spacings to invert the compression operations. For the following description, the variable $s(n)$ represents a decoded sample output. The FIFO buffer 804 stores N previous samples $s(n-1)$ to $s(n-N)$, where the delay element 802 provides $s(n-1)$. The selector 806 selects a sample $s(n-m)$ with the desired sample separation from the FIFO buffer 804. The add/subtract element 808 computes the sum or difference between the current decoded sample $s(n)$ and the selected sample $s(n-m)$ to form a first result $s1(n)$. If add/subtract element 808 is configured to add, the result $s1(n)$ represents a first integral $s1(n)=s(n)+s(n-m)$. When the sample spacing index m=1, the result $s1(n)$ is the first integral of adjacent decoded samples. When the third selector 816 is set to "1", the first result $s1(n)$ is delayed by a second delay element 810 to form $s1(n-1)$ and provided to a second FIFO buffer 812. The second FIFO buffer 812 may store up to M samples of s1 from $s1(n-1)$ to $s1(n-M)$. The second selector 814 selects a sample $s1(n-p)$ from the second FIFO buffer 812 for input to the second adder/subtractor 818. The third selector 816 provides the other input to the adder/subtractor 818. When the third selector 816 is set to "1", the sample $s1(n)$ is input to the second adder/subtractor 818. When the second adder/subtractor 818 is configured to add, the result is the second integral $s2(n)=s1(n)+s1(n-p)$.

When the sample spacing indices are m=1 and p=1, the resulting $s2(n)$ is the second integral over adjacent decoded samples. The fourth selector 800 selects the sample $s(n)$, $s1(n)$ or $s2(n)$ indicated by the corresponding decompression parameter and provides the selected sample to the multiplier 822. The multiplier 822 multiplies the selected sample by a gain factor to invert the attenuation factor applied by attenuator 332. If attenuation was not applied during compression, the gain factor is set to "1" or the multiplier 822 is bypassed. The gain factor is provided by the decompression controller 820 and is based on attenuation information typically stored in each compressed packet header. The FIFO buffers 804 and 812 store N and M samples, respectively, to accommodate different data structures, as described above for the integer compression logic, which includes the redundancy remover 306 and the bit packer 308.

The adaptive decompressor architecture supports decompression of multidimensional data structures or multiplexed data structures using API parameter settings. For the 2D data set example, where N equals the number of samples representing a row of a 2D data set (or an image), the first selector 806 is set to select $s(N)$ and the first adder/subtractor 808 is configured to add, the resulting $s1(n)=s(n)+s(n-N)$ sums the decoded samples to reverse the difference operation of adjacent rows performed for compression. When the second selector 814 is set to select "1", the third selector 816 is set to select "0", and the second adder/subtractor 818 is configured to add, the resulting $s2(n)=s(n)+s(n-1)$ sums decoded samples to reverse the difference operation of samples within the same row performed for compression. For the multiplexed data example described above, N represents the number of multiplexed channels. When the first selector 806 is set to select $s(n-N)$ and the first adder/subtractor 808 is configured to add, the resulting $s1(n)=s(n)+s(n-N)$ reverses the difference between temporally consecutive samples from the same data channel performed for compression. When the second selector 814 selects samples from the second channel offset from the first channel and the second adder/subtractor 818 is configured to add, the difference $s2(n)=s(n)+s(n-p)$ reverses the difference between two different channels performed for compression. The fourth selector 800 selects from $s(n)$, $s1(n)$ or $s2(n)$ based on the compression parameter from the compressed packet header.

The adaptive decompressor architecture supports decompression of data having different center frequencies. The selectors 806 and 814 select sample spacing and the addition or subtraction operations to reverse the operations performed by the adaptive compressor and the samples based on their center frequency. The selection parameter for the third selector 816 is set to "1" for calculating second order integrals. The configurations of the adder/subtractors 808 and 818 reverse the operations of the adder/subtractors 348 and 358.

The fourth selector 800 makes selections of $s(n)$ or $s1(n)$ corresponding to the initialized data of the compressed packet. When the first derivatives or differences $x1(n)$ are encoded for a particular compressed packet, at least the initial sample for the packet will be absolutely encoded. For the initial decoded sample from the compressed packet, the fourth selector 800 may select $s(n)$ as the initial sample. The fourth selector 800 would select the first integral $s1(n)$ for the remaining decoded samples from the compressed packet. When the second derivatives $x2(n)$ are encoded for a particular compressed packet, the fourth selector 800 may select the sample $s(n)$ for the initial sample and the first integral $s1(n)$ for the second sample, and the second integral $s2(n)$ for the remaining decoded samples from the compressed packet. This initialization may be performed at least once for decoded samples from a compressed packet, depending on the initialization performed during compression.

The decompression controller 820 may provide the decompression parameters for the components of the adaptive decompressor, including the gain factor for the multiplier 822, the sample separation parameters for the selectors 806 and 814, add/subtract configuration parameters for the adder/subtractors 808 and 818 and selection parameters for the selectors 816 and 800. The decompression controller 820 may determine the decompression parameters based on the compression parameters from the compressed data packet header.

The floating-point postprocessor 405 may include an integer-to-float format converter, to convert the integer output of the signal regenerator 404 to a floating-point format. A first alternative for integer-to-float format converter corresponds to the float-to-integer format converter that uses the F_SCALE factor. This integer-to-float format conversion implements the following:

$$fp\_samp = int\_same/F\_SCALE$$

where, "fp_samp" indicates the reconstructed floating-point sample and "int_samp" indicates the decompressed integer sample output from signal regenerator 404.

An integer-to-float format converter in accordance with an alternative embodiment, corresponds to the alternative float-to-integer format conversion described above. Each input sample comprises the sign and the decompressed integer mantissa in a 2's-complement format. An inverter is applied to the decompressed integer mantissa and then the engine adds "1" to the inverted mantissa to produce the mantissa, neg_mant, for a negative number. The decompressed integer mantissa provides the mantissa, pos_mant, for a positive number. The converter engine responds to the sign value to select pos_mant if the sign value is "0" or neg_mant if the sign value is "1". The engine analyzes the decompressed integer mantissa to determine the leading "1", which is the leftmost nonzero bit that is not a sign extension bit. The bit position, b, is used to determine e_shift by the following:

$$e\_shift = Nbits - 1 - b$$

To reconstruct the mantissa, a left-shifter shifts the selected mantissa based on the e_shift value and the hidden bit is cleared. For the IEEE 754 standard, the reconstructed mantissa would have 23 bits for single precision or 52 bits for double precision. To reconstruct the exponent, the engine computes the difference of e_shift and EXP_SCALE. For the IEEE 754 standard, the reconstructed exponent would have 8 bits for single precision or 11 bits for double precision. Alternatively, when the original floating-point number was scaled by F_SCALE, the EXP_SCALE value is not used. In this case, the e_shift provides the exponent value, exp, and the reconstructed floating-number is divided by F_SCALE. Parameters EXP_SCALE or F_SCALE may be stored in one or more packet headers of the compressed packets.

The image postprocessor 406 performs image encoding functions, including the complement of functions performed at the image preprocessor, such as realigning the R, G and B components where they have been separated for compression, and performing such image encoding as desired.

The number aligner 409 aligns the outgoing data with the bus format, in a manner complementary to that discussed above in connection with the number aligner 301 in the compression resources of FIG. 9.

The function of the direct floating-point compression engine 309 in the compression resources of FIG. 9, and the complementary function of direct floating-point decompression engine 407 can be understood with reference to FIGS. 13 and 14.

FIG. 13 illustrates a two bin direct floating-point process "FP2." The two bin direct floating-point process of FIG. 13 accepts an input floating-point sample 500 which includes a mantissa, an exponent and a sign bit. The exponent of this sample is compared against an exponent threshold (501). If the exponent is greater than the threshold, then the sample is placed in an above threshold bin 502 and encoded by a leading signal bit '1', followed by the sign, full exponent and full mantissa which results in a one bit expansion of the input sample. Thus, for a 32-bit input floating-point sample 500, samples that are placed in the above threshold bin 502 are encoded using 33 bits. If the exponent of this number is less than the threshold, then the sample is placed in the below threshold bin 503. Samples assigned to the below threshold bin 503 are encoded by a signal bit '0'. Thus, samples placed in the below threshold bin 503 are compressed to a single bit. This results in loss of the data in samples that have exponents below the threshold. However, in some applications, these low magnitude samples can be ignored and the loss is insignificant.

The compressed packets can be formed from the binned samples as shown in FIG. 14. The logic accepts a sequence 550 of floating-point samples, which in this example includes eight numerals. Each sample in the sequence is compared against an exponent threshold 551. The signal bit for each sample is placed in a signaling byte 553. The contents of the samples placed in the above threshold bin (e.g. samples float (i), float (i−5) and float (i−6) out of the eight samples in a packet) are placed in sequence in the packet. The contents of the samples placed in the below threshold bin are omitted.

The direct floating-point compression engine 309 can also implement a four-bin process, where the exponents are compared against three thresholds. A signaling code of two bits is used to indicate the bin for the sample. Samples below the lowest threshold can be encoded with zero bits plus the indicator bits. Samples below the second threshold and above the lowest threshold can be encoded with the indicator bits and only the exponent of the threshold, or only the exponent of the sample for example. Samples between the second and third thresholds can also be encoded with the indicator bits and the exponent of the threshold, the exponent of the sample, or a combination of the exponent of the sample and the most significant bits of the mantissa. Samples above the third threshold can be included in full. In one example, a four-bin process can encode the values as follows:

Bucket 0: 32 original bits
Bucket 1: 24 upper bits (drop 8 mantissa bits)
Bucket 2: 16 upper bits (drop 16 mantissa bits)
Bucket 3: 0 bits The direct floating-point decompression engine 407 for the direct floating-point compression algorithm simply reconstitutes the samples according to the input floating-point format utilizing the available data. Thus, for the two-bin process, the below threshold samples are reconstituted as a zero value in the floating-point format. For the four-bin process, the reconstituted floating-point format samples increase in accuracy for higher exponents, in a manner complementary to the encoding process.

Some of the control parameters for the compression modes described above are encoded in the compression DMA descriptor (Table 2) and the packet header of the compressed data packet (Table 5). For the compression DMA descriptor, the parameters are related as follows:

N_FIFO: corresponds to N in FIGS. 11 and 12.
RR_STRIDE2: corresponds to the sample separation parameter for the selector 354 (FIG. 11) and the selector 814 (FIG. 12).

RR_MANUAL_STRIDE1: corresponds to a manual setting for the sample separation parameter for the selector 346 (FIG. 11) and the selector 806 (FIG. 12).

RR_MANUAL_ADD_SUB: corresponds to manual settings for the add/subtract elements 348 and 358 (FIG. 11) and the add/subtract elements 808 and 818 (FIG. 12).

RR_MANUAL_DERIV: corresponds to a manual setting of the selection parameter for the selector 362 (FIG. 11) and selector 800 (FIG. 12).

RR_AUTO_MANUAL: corresponds to providing automatic or manual settings for three parameters: sample separation parameter STRIDE1 for the selector 346 (FIG. 11) and the selector 806 (FIG. 12), ADD_SUB settings for the add/subtract elements 348 and 358 (FIG. 11) and the add/subtract elements 808 and 818 (FIG. 12), and DERIV selection parameter for the selector 362 (FIG. 11) and selector 800 (FIG. 12).

ATTEN: corresponds to the attenuation factor for the attenuator 332 in FIG. 11.

EXP_THRESH: corresponds to the exponent threshold "eThresh" in FIG. 13.

For the packet header of the compressed data packet, the parameters are related as follows:

ATTEN: corresponds to the attenuation factor for the attenuator 332 in FIG. 11.

STRIDE1: corresponds to the sample separation parameter for the selector 346 (FIG. 11) and the selector 806 (FIG. 12).

ADD_SUB: corresponds to settings for the add/subtract elements 348 and 358 (FIG. 11) and the add/subtract elements 808 and 818 (FIG. 12).

DERIV: corresponds to the selection parameter for the selector 362 (FIG. 11) and selector 800 (FIG. 12).

MAX_EXP: corresponds to the EXP_SCALE value used by the floating-point preprocessor 302 (FIG. 9) and the floating-point postprocessor 405 (FIG. 10).

Based on the foregoing, it can be seen that compression and decompression resources are provided configured as an API that specifies a plurality of compression modes, for a plurality of data types, and application of those compression modes in a data path between a first memory, which can have a relatively low latency, and a second memory, which can have a latency greater than that of the first memory. In the example discussed with reference to FIGS. 3-14, this data path runs between memory on the processor, including cache memory and registry files, and the like, that are coupled to a bus or bus fabric that is coupled to a memory controller, and off-chip main memory such as can be implemented using high-speed double data rate, dynamic random access memory.

Compression modes that can be specified using an API and the resources described herein, can include the following:

a) Lossless integer compression mode, where the decompressed signal is bit-for-bit identical to the input signal.

b) Average-rate integer compression mode, where the compression engine maintains a user-specified compression ratio, over a set of packets. For example, for a set of packets greater than 20, a compression control parameter provided according to the API, APAX_MODE[11:0], specifies a parameter cParam, which provides a target number of words per compressed packet. This parameter can be calculated as follows:

```
if bitsPerSamp == 8 {
    dWordsPerSamp = floor(APAX_PKT_LENGTH / 4);
} elseif bitsPerSamp == 16 {
    dWordsPerSamp = floor(APAX_PKT_LENGTH / 2);
} else
    dWordsPerSamp = APAX_PKT_LENGTH;
cParam   = (int) (dWordsPerSamp / compRatio);
``` c) Fixed-quality integer compression mode, where a signal-to-noise ratio SNR provided according to the API is tracked by the compression engine to manage the attenuator. For example, a user specified dynamic range selection (user_dB) can be converted to an attenuator value cParam written to APAX_MODE[11:0] as follows:

$$cParam=(int)floor((192.0-user\_dB)/(6.02/16))$$

d) Constant-rate integer compression mode, where each compressed packet fits a not-to-exceed size, which can be provided according to the API. The constant-rate mode can be controlled by setting the attenuator value to achieve the desired packet size.

e) Converted floating-point integer compression modes, where a floating-point input value is converted to an integer value as discussed above, and one of the integer compression modes is applied.

f) Floating-point bin compression modes, as discussed above, or other direct floating-point compression algorithms, which can be specified according to the API.

Thus, the status register, descriptor register, packet header and file headers described above provide an API usable by compression and decompression engines implemented in a variety of settings, on a variety of hardware platforms in a hardware assisted form, on a variety of platforms in a software only form, and for a variety of use cases. The API provides a framework against which compress resources can be designed and implemented in any underlying platform capable of executing the needed processes. Thus, a system including API compliant compression operations as described herein, can include library files for functions such as:

MEMORY← →MEMORY:

Memcpy_c: compress source operands and write compressed version to destination (extending the standard C or C++ language library function memcpy using an API compliant compression function).

Memcpy_d: read compressed version from src and write uncompressed to destination (extending the standard C or C++ language library function memcpy using an API compliant decompression function).

MEMORY← →DISK:

fopen_c: initializes a compressed file descriptor & writes compressed DMA descriptor parameters into the compressed file header (or reserves room for compressed file header and writes descriptor parameters during fclose) (extending the standard C or C++ language library function fopen using an API compliant compression function).

fwrite_c: performs compression prior to writing compressed array to disk (extending the standard C or C++ language library function fwrite using an API compliant compression function).

fread_c: performs decompression after reading compressed array from disk (extending the standard C or C++ language library function fread using an API compliant decompression function).

fseek_c: position file pointer at the start of a specific compressed packet; works with a directory of packet pointers that support random access into a compressed stream (extending the standard C or C++ language library function fseek using an API compliant compression function).

Multi-Core Computer System/Supercomputer:

MPI_SEND_C+MPI_RECV_C: compress at transmitter and decompress at receiver (extending the standard C or C++ language library functions MPI_SEND and MPI_RECV from the standard Message-Passing Interface specification, using API compliant compression and decompression functions).

MPI_PACK_C+MPI_UNPACK_C: compress at transmitter and decompress at receiver (extending the standard C or C++ language library functions MPI_PACK and MPI_UNPACK using API compliant compression and decompression functions).

The API described herein can include new compiler-supported compressed datatypes such as cInt, cFloat, cImage that correspond to uncompressed Int, Float and Image data types. Thus, an operation can declare the uncompressed (original) datatype—to be compressed by API compliant library functions, initialize compressed datatype (compression mode & parameters), perform memWrites with special operation that compresses, perform mem reads with special operation that decompresses, and manage compressed memory and random access (indexing) to uncompressed data in the compressed memory.

Figure 15:
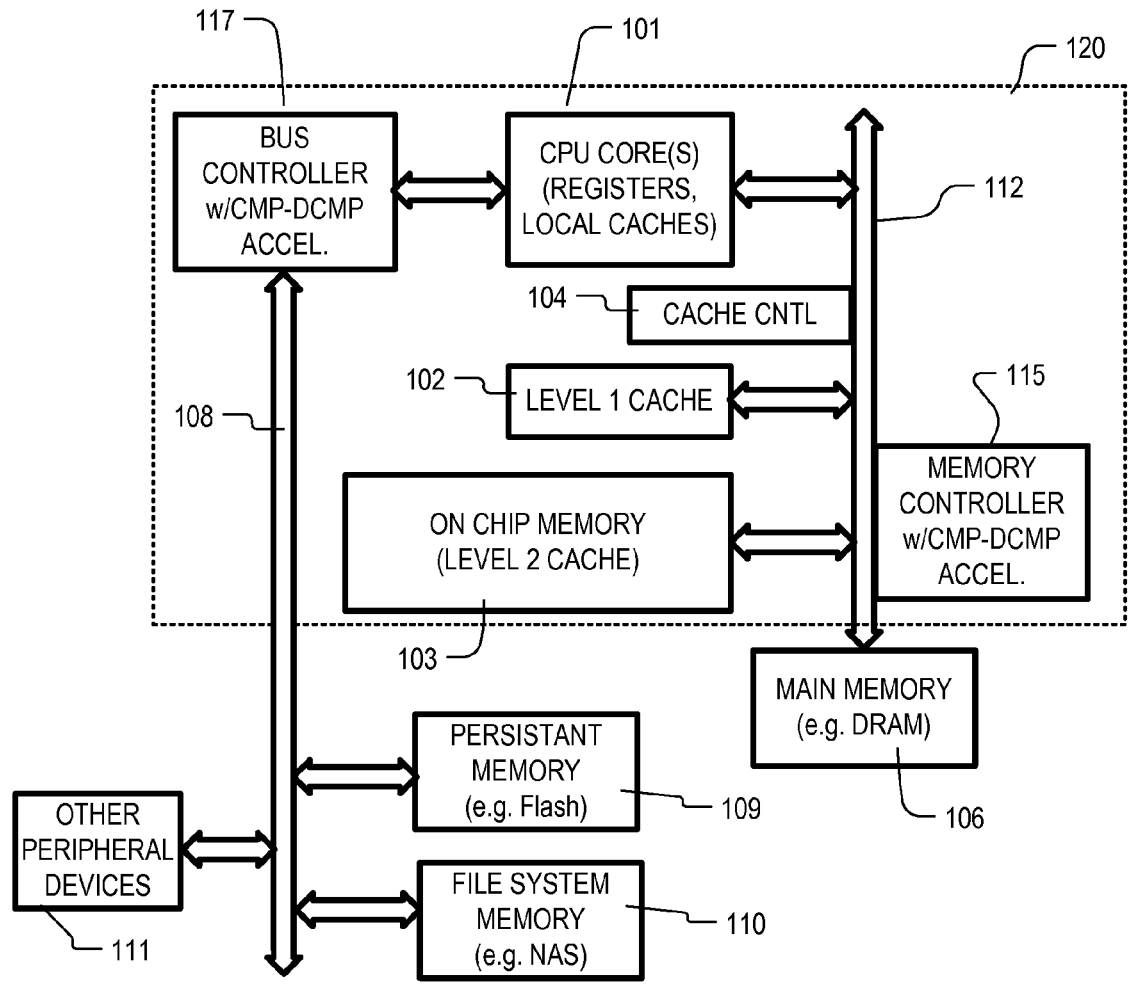
FIG. 15 is a diagram of a processor including an integrated circuit having a processor core used to execute application programs with two instances of compression and decompression accelerator logic, on-chip memory and other memory elements off-chip.
Figure 16:
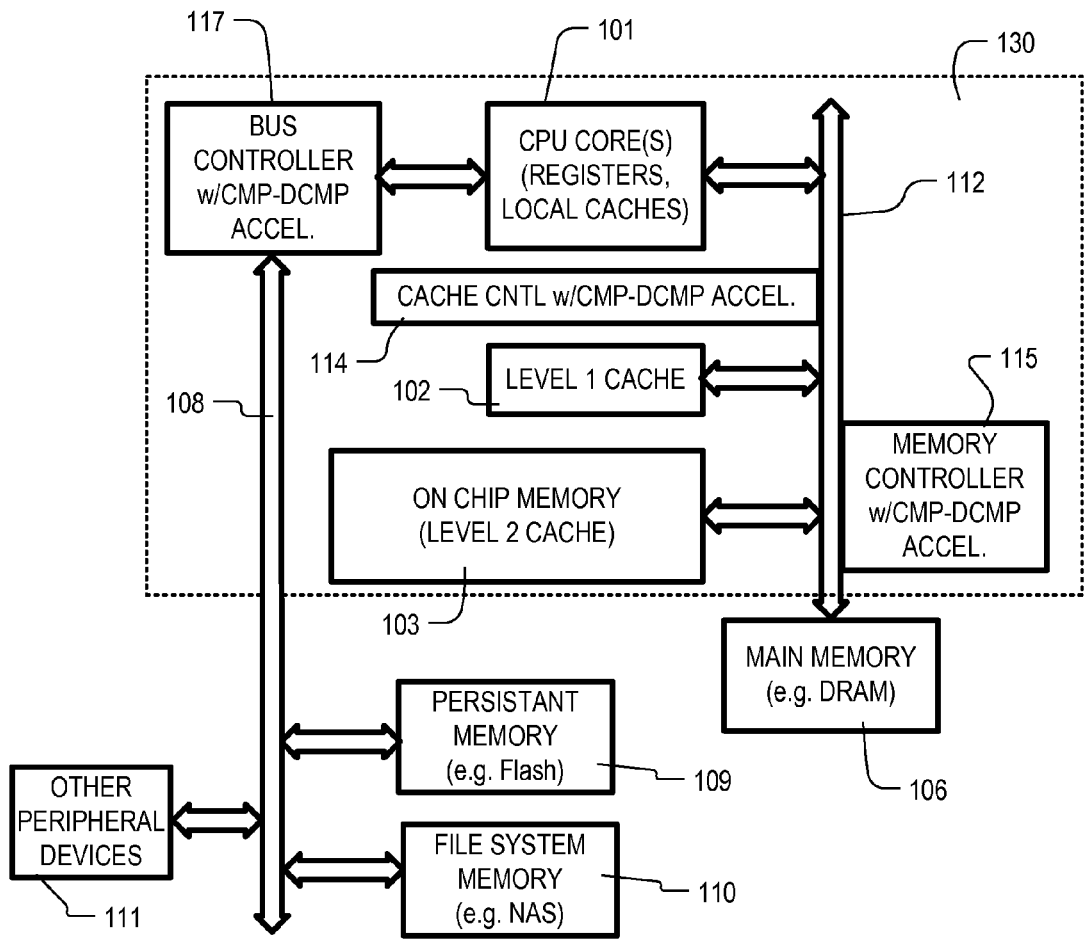
FIG. 16 is a diagram of a processor including an integrated circuit having a processor core used to execute application programs with three instances of compression and decompression accelerator logic, on-chip memory and other memory elements off-chip.

FIGS. 15 and 16 are simplified block diagrams of a processing system like that of FIG. 3, illustrating the use of hardware acceleration on channels in addition to the memory controller block 115. Thus, FIGS. 15 and 16 show respective integrated circuits 120 and 130, each of which includes a central processing unit CPU core(s) 101 (i.e. one or more cores) on-chip. The CPU core 101 is coupled to a memory hierarchy including a level 1 cache 102 and other on-chip memory 103, which can comprise a level 2 cache, multiple cache levels, and/or directly addressable memory space. In other implementations, different cache hierarchies can be implemented, including hierarchies that include a level 3 cache. The level 1 cache 102 and on-chip memory 103 are coupled via a communication fabric represented for simplicity by single bus 112 to an off-chip main memory 106 which can comprise high-speed dynamic random access memory or the like. A cache control block 104 is shown in FIG. 15 coupled to the bus 112, and performs cache management, including cache hit and miss operations, cache line replacement operations, predictive cache fill operations, and the like, in the system of FIG. 15. In the system of FIG. 16, a cache control block 114 is included that is extended with compression and decompression acceleration logic that can support API compliant compression and decompression functions. In some embodiments, cache lines can be configured to include a data type flag that facilitates high speed compression and decompression operations for cache fill and write back operations. Also, a memory controller block 115 is shown coupled to the bus 112, and manages communication of data among the CPU cores 101, the level 1 cache 102, other on-chip memory 103 and the off-chip main memory 106. The memory controller block 115 may include direct memory access DMA logic to support data communications on the bus 112. In these embodiments, the memory controller block 115 also includes compression and decompression acceleration logic which supports an API compliant compression/decompression library that can be utilized by programs executed using the processing system. Each of the respective integrated circuits 120 and 130 in FIGS. 15 and 16 also includes a bus controller 117 which is connected to a bus 108 that is arranged for communication with off-chip memory, such as persistent memory 109 which may be implemented using flash memory or the like, and file system memory 110 which may be implemented using disk drives or network attached storage. The bus controller 117 in these examples includes compression and decompression acceleration logic which supports an API compliant compression/decompression library that can be utilized by programs executed using the processing system. The bus 108 can also be configured to communicate data between the integrated circuit 100 and other peripheral devices 111. The bus 108 can be configured according to a wide variety of bus architectures. In some examples, the bus 108 can be configured as a bus compliant with an industry-standard, like PCI Express.

The compression and decompression acceleration logic on the cache control block 114, memory controller block 115 and in the bus controller 117 can comprise supporting circuitry for one or more channels, the number of which is selected during design of the integrated circuit 100. A compression/decompression library can include a component that is linked to an application program for the purposes of initializing and controlling compression and decompression channels through the acceleration logic. FIGS. 3, 15 and 16 represent, in a simplified format, a plurality of variant hardware architectures for which API compliant compression resources can be implemented using library files that operate using the API, and are compiled for execution according to the underlying hardware platform.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A computer system, comprising:
  a data processor and memory accessible by the data processor, the memory storing computer programs executable by the data processor, including at least one application program and a set of functions that use parameters and implement operations of an application program interface (API) for processes that move a data set between elements of the memory, and perform compression and decompression of data in the data set, the at least one application program including:
    a process to move a data set between a first element of the memory to a second element of the memory, the application program being responsive on execution by the data processor to call the API, the call including parameters and identifying operations of the API, the parameters including a location of the data set to be moved, an identifier of a data type for the data set to be moved, and an identifier of a characteristic of a data compression procedure to be applied, to perform data compression according to the identified characteristic of the data compression procedure on the data set in the first element of the memory to form a compressed data set, and to store the compressed data set in the second element of the memory.

2. The system of claim 1, wherein parameters of the API include indicators of a compressed data set location, an uncompressed data set location, and a selected compression mode.

3. The system of claim 2, wherein operations of the API include engines that perform data move operations between the compressed data set location and the uncompressed data set location, in which data move operations one of compression and decompression is performed, as specified by the parameters.

4. The system of claim 1, wherein a set of different algorithms is included in the operations of the API, and a selected one of the different algorithms applied for compression and decompression operations in the process to move data specified by the parameters of the API.

5. The system of claim 4, wherein the set of different algorithms includes algorithms specialized for data types identified in the parameters of the API.

6. The system of claim 4, wherein the set of different algorithms includes an algorithm for compression of floating-point numbers, and an algorithm for compression of integers.

7. The system of claim 4, wherein the set of different algorithms includes an algorithm for compression of image data.

8. The system of claim 4, wherein the set of different algorithms includes an algorithm specialized for lossless compression, and an algorithm specialized for lossy compression.

9. The system of claim 4, wherein the set of different algorithms includes an algorithm specialized to achieve a compression ratio specified by a parameter of the API.

10. The system of claim 4, wherein the set of different algorithms includes an algorithm specialized to achieve a compression quality, specified by a parameter of the API.

11. The system of claim 1, wherein the application program is responsive on execution by the data processor to call the API using parameters of the API, the parameters including an identifier of the data set to be moved, an identifier of a data type for the data set to be moved, and an identifier of a characteristic of a data decompression procedure to be applied, and to perform data decompression according to the identified characteristic of the data decompression procedure on the data set in the second element of the memory to form a decompressed data set, and to store the decompressed data set in the first element of the memory.

12. The system of claim 11, wherein at least one characteristic of the data decompression procedure on the data set in the second element of the memory is included within the compressed data set stored in the second element of the memory.

13. The system of claim 1, wherein the data processor includes a hardware compression logic unit, and the set of programs includes at least one program that utilizes the hardware compression logic unit to support said data compression including a compression descriptor register, and wherein said at least one program writes at least one of the parameters of the API to the descriptor register.

14. The system of claim 1, wherein the API includes an operation to write a file header including parameters of the API.

15. The system of claim 1, wherein the compressed data set includes packets having packet headers, and the API includes a compression engine that is responsive to redundancy removal parameters which can change during compression, and that stores the redundancy removal parameters in the packet headers.

16. The system of claim 1, wherein the API includes a compression engine that is responsive to redundancy removal parameters that are static during compression, and that stores the redundancy removal parameters in a descriptor register or in a file header associated with the data compression procedure.

17. The system of claim 1, wherein the identifier of a data type identifies one of a supported set of data types, the set including one-dimensional and two-dimensional data types.

18. The system of claim 1, wherein the identifier of a data type identifies one of a supported set of data types, the set including integer data types and floating-point data types.

19. The system of claim 1, wherein the identifier of a data type identifies one of a supported set of data types, and the parameters of the API include a bit width indicator for at least one of the supported sets of data types.

20. The system of claim 1, wherein the identifier of a data type identifies one of a supported set of data types, and the parameters of the API include a signed vs. unsigned indicator for at least one of the supported set of data types.

21. The system of claim 1, wherein the identifier of a data type identifies one of a supported set of data types, including a two-dimensional data type and the parameters of the API include indicators of a number of pixels per row and a number of pixels per column for the two-dimensional data type.

22. The system of claim 1, wherein the identifier of a data type identifies one of a supported set of data types, including a two-dimensional data type and the parameters of the API include indicators of a color encoding selection for the two-dimensional data type.

23. The system of claim 1, wherein the data processor includes an integrated circuit having one or more processor cores, and the memory includes a first memory element on the same integrated circuit as one of the processor cores, and a second memory element on a separate integrated circuit, and wherein operations of the API include engines that perform data move operations between the compressed data set location in the second memory element and the uncompressed data set location on the first memory element, in which data move operations one of compression and decompression is performed, as specified by the parameters.

24. An article of manufacture, comprising:
a memory readable by a data processor, the memory storing instructions executable by the data processor, the instructions comprising a library of functions compliant with an application programming interface (API), the API comprising a set of functions that use parameters and implement operations of the API for processes that move a data set between elements of the memory, and perform compression and decompression of data in the data set.

25. The article of manufacture of claim 24 wherein the instructions stored in the memory include an application program that comprises:
a process to move a data set between a first element of memory to a second element of memory accessible by the data processor, the application program being responsive on execution by the data processor to call the API, the call including parameters and identifying operations of the API, the parameters including a location of the data set to be moved, an identifier of a data type for the data set to be moved, and an identifier of a characteristic of a data compression procedure to be applied, to perform data compression according to the identified characteristic of the data compression procedure on the data set in the first element of the memory to form a compressed data set, and to store the compressed data set in the second element of the memory.

26. The article of manufacture of claim 24, wherein parameters of the API include indicators for a selected compression mode, an uncompressed data set location and a compressed data set location.

27. The article of manufacture of claim 26, wherein operations of the API include engines that perform data move operations between the compressed data set location and the data set uncompressed location, in which data move operations one of compression and decompression is performed, as specified by the parameters.

28. The article of manufacture of claim 26, wherein a set of different algorithms is included in the operations of the API, and a selected one of the different algorithms applied for compression and decompression operations in the process to move data is specified by the parameters of the API.

29. The article of manufacture of claim 28, wherein the set of different algorithms includes algorithms specialized for data types identified in the parameters of the API.

30. The article of manufacture of claim 28, wherein the set of different algorithms includes an algorithm for compression of floating-point numbers, and an algorithm for compression of integers.

31. The article of manufacture of claim 28, wherein the set of different algorithms includes an algorithm for compression of image data.

32. The article of manufacture of claim 28, wherein the set of different algorithms includes an algorithm specialized for lossless compression, and an algorithm specialized for lossy compression.

33. The article of manufacture of claim 28, wherein the set of different algorithms includes an algorithm specialized to achieve a compression ratio specified by a parameter of the API.

34. The article of manufacture of claim 28, wherein the set of different algorithms includes an algorithm specialized to achieve a compression quality specified by a parameter of the API.

35. The article of manufacture of claim 24, wherein the API includes an operation to write a file header including parameters of the API.

36. The article of manufacture of claim 24, wherein the compressed data set includes packets having packet headers, the API includes a compression engine that is responsive to redundancy removal parameters which can change during compression, and that stores the redundancy removal parameters in the packet headers.

37. The article of manufacture of claim 24, wherein the API includes a compression engine that is responsive to redundancy removal parameters that are static during compression, and that stores the redundancy removal parameters in a descriptor register or in a file header associated with the data compression procedure.

38. The article of manufacture of claim 24, wherein the identifier of a data type identifies one of a supported set of data types, the set including one-dimensional and two-dimensional data types.

39. The article of manufacture of claim 24, wherein the identifier of a data type identifies one of a supported set of data types, the set including integer data types and floating-point data types.

40. The article of manufacture of claim 24, wherein the identifier of a data type identifies one of a supported set of data types, and the parameters of the API include a bit width indicator for at least one of the supported set of data types.

41. The article of manufacture of claim 24, wherein the identifier of a data type identifies one of a supported set of data types, and the parameters of the API include a signed vs. unsigned indicator for at least one of the supported set of data types.

42. The article of manufacture of claim 24, wherein the identifier of a data type identifies one of a supported set of data types, including a two-dimensional data type and the parameters of the API include indicators of a number of pixels per row and a number of pixels per column for the two-dimensional data type.

43. The article of manufacture of claim 24, wherein the identifier of a data type identifies one of a supported set of data types, including a two-dimensional data type and the parameters of the API include indicators of a color encoding selection for the two-dimensional data type.

* * * * *